United States Patent [19]

Takeuchi et al.

[11] Patent Number: 5,706,474
[45] Date of Patent: Jan. 6, 1998

[54] SYNCHRONOUS MEMORY SYSTEM WITH ASYNCHRONOUS INTERNAL MEMORY OPERATION

[75] Inventors: Kan Takeuchi, Kodaira; Masashi Horiguchi, Kawasaki; Masakazu Aoki, Tokorozawa; Takeshi Sakata, Kunitachi; Hitoshi Tanaka, Ome; Katsumi Matsuno, Kokubunji, all of Japan

[73] Assignees: Hitachi, Ltd.; Hitachi ULSI Engineering Corporation, both of Tokyo, Japan

[21] Appl. No.: 455,155

[22] Filed: May 31, 1995

[30] Foreign Application Priority Data

Jun. 6, 1994 [JP] Japan .................... 6-123412

[51] Int. Cl.⁶ .................................................. G06F 12/00
[52] U.S. Cl. .................................. 395/500; 395/551
[58] Field of Search ........................ 395/500, 425, 395/551, 555, 556, 558, 494, 497.01; 364/200, 270.5, 270.6, 270.9, 950.1, 950.3, 271, 271.4; 327/323

[56] References Cited

U.S. PATENT DOCUMENTS

| | | | |
|---|---|---|---|
| 4,513,374 | 4/1985 | Hooks, Jr. ............................. | 364/200 |
| 5,404,338 | 4/1995 | Murai et al. ........................... | 365/233 |
| 5,498,990 | 3/1996 | Leung et al. .......................... | 327/323 |
| 5,550,783 | 8/1996 | Stephens, Jr. et al. ................ | 365/233 |

FOREIGN PATENT DOCUMENTS

| | | |
|---|---|---|
| 57-150190 | 9/1982 | Japan . |
| 5-120114 | 5/1993 | Japan . |

*Primary Examiner*—Kevin J. Teska
*Assistant Examiner*—Dan Fiul
*Attorney, Agent, or Firm*—Fay, Sharpe, Beall, Fagan, Minnich & McKee

[57] ABSTRACT

A memory system is provided which is capable of eliminating deterioration in a processing rate due to possible signal delays between an input/output circuit and memory blocks. Complication of design is also reduced, especially when the scale and chip area of the memory system increase. A memory chip includes a plurality of memory array blocks each including an address buffer and an address counter, and operates on the basis of a local clock cycle. A control circuit is synchronous with a clock of an external device, and synchronous data-transfer circuitry includes a buffer which modulates the transfer rate of serial data which arrives from a memory array block at a local clock cycle so as to be synchronous with the clock of the control circuit. External clock signal lines are not distributed to the memory array blocks.

27 Claims, 16 Drawing Sheets

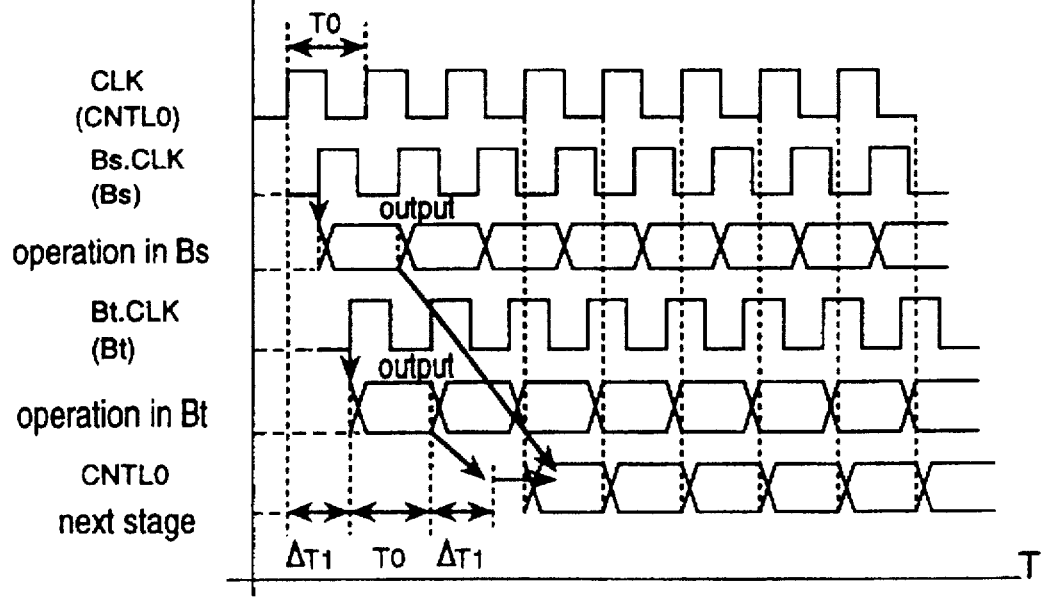
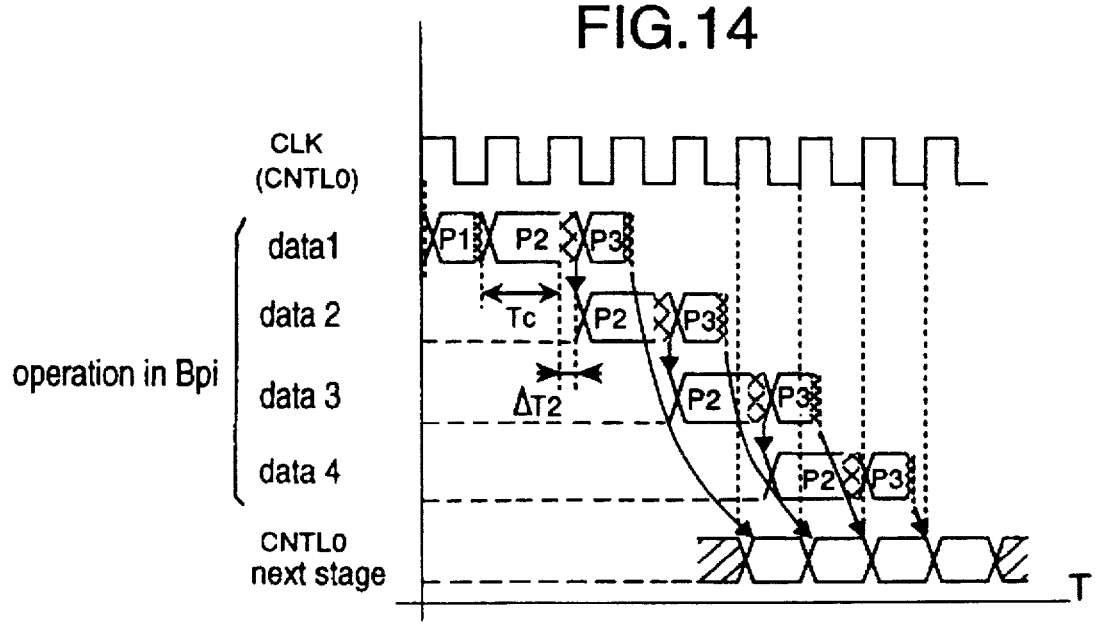

SYNCHRONOUS MEMORY SYSTEM WITH ASYNCHRONOUS INTERNAL MEMORY OPERATION

BACKGROUND OF THE INVENTION

The present invention relates to high-speed, low current consumption, high reliability and easy design memory systems, and more particularly to a memory system including an architecture for synchronous data transfer between a central processing unit (CPU) and a plurality of memory chips or between an input/output unit and memory array blocks in a memory chip.

Recently, memory systems of semiconductor devices or electronic devices have been constructed such that the whole system operates synchronously with a clock. FIG. 18 illustrates the structure of a conventional memory system controlled synchronously with a clock. The system Sy1 is composed of memory blocks Bc1, Bc2, . . . , each of which is controlled by a control circuit CNTLc. For example, assume that the system Sys1 is a memory chip. In this case, the memory block Bc1 is a memory array block of the chip whereas the control circuit CNTLc is an interface for an external device. In order to operate the memory chip Sys1 synchronously with an external device, for example, a CPU (not shown), clock signal lines 10 extend from the CPU throughout the whole chip. The details of the synchronous memory chip are described, for example, in JP-A-5-120114. The architecture allows the system to be designed easily and to achieve an increased speed operation because, for example, when the CPU requires delivery of data from the memory chip Sys1, the CPU can always get the data synchronously with a clock after a fixed delay, and because the architecture is suitable for employing a pipeline system in the memory chip Sys1, which enables the high-speed operation.

In order to output consecutive data at high speed, a parallel data outputting scheme is known in addition to the above pipeline arrangement in which the whole system operates synchronously with a single clock. More particularly, this scheme involves outputting at least a part of consecutive data in parallel and collectively to a predetermined buffer, storing the output data temporarily in the buffer, and outputting the stored data sequentially at high speed from the buffer to an external device, for example, as disclosed in JP-A-57-150190.

SUMMARY OF THE INVENTION

The former conventional memory system Sys1 which operates synchronously with the single clock has the following problems:

(1) As shown in FIG. 19, distribution of clock delays in the system degrades the processing speed of the system. FIG. 19 shows operation waveforms which explain a difference between clock delays in the conventional clocked synchronous type system. In FIG. 19, CLK (CNTLc) denotes a clock waveform in the control circuit CNTLc; CLK (Bcs) denotes a clock waveform in a memory block Bcs disposed near the control circuit CNTLc; CLK (Bct) denotes a clock waveform in a memory block Bct disposed at a position more remote from the control circuit CNTLc than the memory block Bcs; "operations in Bcs and Bct" denote waveforms indicative of data processing in the memory blocks Bcs and Bct, respectively; and "CNTLc next stage" shows a waveform indicative of the processing of a work after the processing of the preceding work.

As shown in FIG. 19, the memory block Bct disposed at a position more remote from the control circuit CNTLc receives a delayed clock compared to the memory block Bcs disposed closer to the control circuit CNTLc. In order to operate all the memory blocks of the system in a synchronous manner, the cycle of the clock signal CLK (CNTLc) in the control circuit is required to be more than T0+2×ΔT1 where T0 is the time taken for one work to be done in each memory block and ΔT1 is the delay of a signal in the memory block Bct which has the longest path for the signal to reach. The multiple factor of 2 is the sum of a delay of a clock signal CLK (Bct) indicative of the start of the operation of the memory block Bct and the time taken for the output from the memory block Bct to arrive at the control circuit CNTLc. As just described above, there is the problem that the processing time required for the operation of the memory block is delayed by 2×ΔT₁ compared to an ideal clock cycle T0.

(2) As shown in FIG. 20, with a pipeline structure, the operation speed decreases because of the need for a margin for uneven processing times. FIG. 20 shows operation waveforms explaining a deterioration in the operation speed of the conventional clocked pipeline system. In FIG. 20, "operation in Bcr" denotes waveforms indicative of processing data 1–4 in a memory block Bcr in a 3-stage pipeline structure.

As will be obvious in FIG. 20, let the designed processing time of a stage having the longest processing time (in this case, P2) be Tc. There is a problem that the cycle of a clock signal CLK (CNTLc) from the control circuit should be increased by the margin ΔT2 adding to the average processing time Tc in consideration of uneven characteristics and temperature dependency of the devices. In addition, the time taken for the first data to be output through the pipeline is considerably larger than the sum of the processing times of the respective stages P1, P2 and P3 of the pipeline owing to different processing times of the respective pipeline stages. For example, if the pipeline is composed of three stages, the processing time is three times (Tc+ΔT2).

(3) Since the clock signal lines 10 distributed throughout the whole system Sys1 are charged/discharged at the clock frequency, the current consumption would increase, which is marked when the system is operated at an increased speed.

(4) As the clock signal lines 10 distributed throughout the whole system are charged/discharged, a large amount of noise is generated.

(5) The operation timing is required to be determined in consideration of distribution of delays of clock signals in the system, and thus design is complicated.

The above problems are more serious as the chip size, the lengths of the wiring conductors, and the system scale increase.

The above-mentioned conventional parallel output system, which outputs at least a part of the serial data in parallel collectively to the predetermined buffer area, stores the output data temporarily in the buffer area, and then outputs the data sequentially at high speed to an external device, has the following problems:

(1) In order to output data in parallel and collectively, a plurality of input/output lines and main amplifiers is required, which invites an increase in the chip area.

(2) Because a plurality of bits of signals are required to be read simultaneously, the peak value of the consumed power increases.

(3) Even when data of a few bits, for example one bit, is required, a plurality of unnecessary data are read owing to the circuit structure of the system, and the consumed current increases unnecessarily.

It is therefore an object of the present invention to provide a memory system which solves the above problems while making the best of the advantages of operating the memory system synchronously with a clock of an external device. If the memory system is a semiconductor device, it is an object of the present invention to provide a memory system which avoids a deterioration in the processing rate and complication of design due to delays of clock signals in the circuit ranging from an input/output circuit of the chip to its memory array blocks. If the memory system is an electronic device which includes a CPU and a large number of memory chips connected to the CPU, it is an object of the present invention to provide a memory system which avoids a deterioration in the processing rate and complication of design due to possible delays of signals between the CPU and the memory chips even when the memory chips increase in number. It is a further object of the present invention to provide a memory system which reduces the current consumption and noise due to charging/discharging of the clock signal lines and, hence, which reduces power consumption and improves reliability.

In order to achieve the above object, the present invention provides a memory system (for example, an embodiment of FIG. 1) including at least a plurality of memory blocks Bi; and a common control circuit CNTL0 disposed for controlling the respective memory array blocks; synchronous data-transfer circuitry CLKMT0 for modulating the transfer rate of data serially input thereto to a required cycle and outputting the data having the required cycle serially; and a complementary data-line pair I/O which connects an input or buffer BF0 of the synchronous data-transfer circuitry and the memory blocks Bi, wherein the control circuit CNTL0 controls the cycle of the output of the synchronous data-transfer circuitry CLKMT0.

A memory system according to the present invention includes at least a plurality of memory blocks; and a common control circuit for controlling the respective memory blocks, wherein the respective memory blocks include means (for example, an input 7A and an address counter AD.C in the embodiment of FIG. 7(a),) for detecting the two voltage levels of a complementary data-line pair connected to the memory blocks having changed from the same value to different values or vice versa, and thereby for switching addresses where data is written in the respective memory blocks to others. In this case, synchronous data-transfer circuitry CLKMT0 for converting the data serially input at any clock cycle to data having a required cycle and outputting the same serially is preferably provided.

The synchronous data-transfer circuitry CLKMT0 (an embodiment of FIG. 4(a)) includes a buffer BF0 composed of a plurality of registers (flip-flops Fli), and means for cyclically connecting the respective inputs of the registers one at a time to the complementary data-line pair I/O in response to the voltage levels of a pair of data lines DT, DB of the complementary data-line pair I/0 that have changed from the same value to different ones or vice versa, and cyclically connecting the respective outputs of the registers one at a time to an output line of the control circuit CNTL0 which outputs data to an external device (for example, a CPU) in response to a clock signal from the control circuit CNTL0.

In the memory system, the respective memory blocks (for example, Bi) preferably include an address buffer AB and an address counter AD.C, as shown in FIG. 1.

The respective memory blocks include output means for outputting a series of data of consecutive addresses serially to the complementary data-line pair in accordance with an initial address "a" and the number BL of requested data in serial address ("a" and BL are given by the control circuit CNTL0), at respective local clock cycles without control of the control circuit (the output means including a local clock generator Bi.CLK.gen which starts its operation in accordance with a block select signal $\overline{BS}$ in an embodiment of FIG. 7), wherein the maximum number of consecutive data, which is requested from the control circuit, is equal to the number of registers of the buffer BF0 of the synchronous data-transfer circuitry CLKMT0.

Instead of restricting the number BL of data in serial address, the memory system may include a buffer-availability indicating signal generator for monitoring an unoutput data count which has already been transferred from a memory block to a buffer BF0 but not yet output to an external device when the memory block outputs data, and for delivering a pause signal for temporarily stopping the operation of the memory block when this unoutput data count has exceeded a predetermined number (a circuit including a logic circuit Comp0 and a hold circuit HOLD0 for outputting a buffer-availability indicating signal BFST, in FIG. 11).

In this case, preferably, the buffer-availability indicating signal generator further includes means for sending to the memory block a signal which restarts the memory block when the unoutput data count has been reduced to a predetermined number after the transfer of data from the memory block to the buffer BF0 has been stopped by the pause signal.

Alternatively, the memory system may include means for monitoring an unoutput data count which has already been transferred from the memory block to the buffer BF0 but not yet output to an external device in the transfer of data from the memory block to the buffer BF0, and for sending to the control circuit a signal for instructing the control circuit to temporarily stop the outputting of the data from the buffer when the unoutput data count has decreased to a predetermined number (a logic circuit Comp1 for outputting a pause signal Wait to the control circuit CNTL0 in an embodiment of FIG. 12).

The memory system may be a semiconductor memory chip where the memory blocks each include a respective one of the memory array blocks MBi (FIG. 15) of the memory chip and wherein the control circuit includes an interface CNTLm to/from an external device provided in the memory chip.

In this case, each memory array block MBi preferably includes a clock generator MBi.CLK.gen to operate the memory array block at a local clock cycle.

The memory system may be an electronic device which includes a CPU corresponding to the control circuit and a plurality of memory chips each corresponding to the memory block, for example, as shown in FIG. 17.

For example, as shown in FIGS. 1–7, in the memory system according to the present invention, the clock CLK of the external device or CPU is not distributed throughout the whole memory chip Sys0. Only the control circuit CNTL0 which is an input/output interface of the memory chip operates synchronously with the clock signal CLK from the CPU. In the memory chip Sys0, the synchronous data-transfer circuitry CLKMT0 including a buffer BF0 time-adjusts series of incoming data delivered serially through the complementary data-line pair I/O from the respective memory array blocks Bi at their local internal cycles so as to be synchronous with the clocks CLK, and outputs the time-adjusted series data to the control circuit.

The read operation of the memory chip Sys0 is performed as follows: After the CPU delivers an initial address "a" and the number BL of requested data in serial address through the control circuit CNTL0 to the memory array block Bi, including an address buffer AB and an address counter AD.C, each memory array block Bi causes its address counter AD.C to count up to output a series of data one after another at its local clock cycle. In order to output a series of data, delivered from the array block Bi to the buffer By0 at cycles different from that of the CPU, synchronously with the CPU, data from the memory array block Bi is first stored sequentially and temporarily in the different registers FF1i of the buffer BF0. The temporary storage is performed when the synchronous data-transfer circuitry CLKMT0 recognizes arrival of new data by detection of changes in the voltage levels of a pair of data lines DT, DB on the complementary data-line pair I/O from the same value to different ones or vice, versa and thereby connecting the inputs of the registers FF1i to the data line pair one at a time in a cyclic way. In order to output data in the buffer BF0 through the control circuit CNTL0 to the outside in accordance with the clock cycle CLK of the CPU in substantial parallel with the temporary storage operation, the synchronous data-transfer circuitry CLKMT0 connects the outputs of the registers FF1i one at a time in a cyclic way to the control circuit CNTL0 synchronously with the clock CLK from the control circuit or CPU. In this way, data from the memory array block $B_i$ is output one after another synchronously with the clock CLK from the CPU without a substantial time delay in its passage through the synchronous data-transfer circuitry CNTL0.

If the number BL of required data in serial address exceeds the capacity of the buffer BF0 and the clock of the memory array block $B_i$ is higher in frequency than the clock CLK of the CPU, the buffer BF0 would be full sooner or later to thereby disable the data transfer. However, according to the present memory system, the buffer BF0 and the address counter AD.C may have a small capacity of a few bits. When a large number of data in series, exceeding the capacity of the buffer BF0 should be output from the memory block array Bi to the CPU, the control circuit CNTL0, for example, first of all, requires the memory array block Bi to transfer a part of serial data equal in bit count to the capacity of the buffer BF0. After receiving clock pulses, the number of which is equal to the number of serial data requested to Bi, the control circuit CNTL0 further requires the memory array block Bi to transfer another part of serial data equal in bit count to the capacity of the buffer BF0. By repetition of this operation, the CPU receives a large number of data in series, exceeding the bit capacity of the buffer BF0 from the memory array block Bi without intermission at the cycles of the clocks CLK of the CPU.

Alternatively, as shown in FIGS. 8–11, when the buffer BF0 is full with transferred data or its remaining capacity is equal to the predetermined value, the buffer BF0 requests a pause signal or a buffer availability indicating signal to be sent to the buffer array block Bi. When the buffer BF0 returns to a substantially empty state, it releases the pause signal. Thus, the CPU can obtain from the memory array block Bi a large number of data in serial address, exceeding the number of bits in the buffer BF0 at the cycle of the clock CLK of the CPU without intermission.

Writing data into the memory chip Sys0 is performed as follows: A series of data from the external device or CPU is delivered as complementary data through the control circuit $CMTL_0$ to the complementary data-line pair I/O. A selected memory array block Bi which has received the data to be written recognizes the data arrival on the basis of changes in the voltage levels of the pair of data lines DT, DB of the complementary data-line pair I/O from the same value to different ones or vice versa, and causes the address counter AD.C in the memory array block Bi to count up to thereby store the data at successive addresses sequentially.

As shown in FIG. 17, by applying the structure of the memory chip Sys0 to an electronic device composed of a CPU and a plurality of memory chips M.Chip i, data transfer between the memory chip M.Chip i and the CPU is performed synchronously with the clock CLK of the CPU without providing a signal line for the CPU clock CLK between the CPU and the memory chip M.Chip i. In this case, the memory array block Bi corresponds to the memory chip M.Chip i whereas the control circuit CNTL0 corresponds to the CPU. The control circuit CLKMT0 is provided in or close to the CPU.

The difference in operation between the memory system of the present invention and the conventional one will be described briefly, using the operation waveforms of FIGS. 13 and 14.

In the structure of the conventional memory system of FIG. 19 where the whole memory system is operated synchronously with a single clock signal, possible different delays of clock signals between the memory blocks of the system hinder an increase in the processing speed of the system. In contrast, as shown in FIG. 13, even when in the present memory system the memory block Bt disposed at a position most remote from the control circuit CNTL0 is, for example, delayed in the reception of clock signals compared to the memory block Bs disposed at a position closer to the control circuit CNTL0, the delayed output of the memory block Bt does not require the next clock pulse at CNTL0 (CLK) to wait to generate until data from the memory block Bt arrives at CNTL0 because the whole memory system does not operate synchronously with a single clock signal. Although the control circuit CNTL0 is required to wait for processing using first data until the first output is transferred from the memory blocks Bs and Bt to the buffer BF0, it performs the processing using the subsequent data at the same processing rate as the memory blocks Bs and Bt.

As just described above, in the conventional memory system, the clock signal CLK of the control circuit has a cycle of T0+2×ΔT1 (a clock delay of the memory block Bt) whereas in the present memory system the clock signal CLK has a cycle of T0, so that different delays of clock signals in the memory system do not influence the clock frequency. Thus, high-speed memory system is provided.

As described in FIG. 20, when a pipeline system is applied to the memory block Bi, the clock cycle must be longer than Tc+ΔT2 in consideration of variations of designed processing times Tc of the longest stage of the pipeline in the conventional memory system. Furthermore, when the processing time varies in dependence on each of the stages (for example, three stages) of the pipeline, the time taken for the first data to be acquired requires about three times the clock cycle Tc+ΔT2. In contrast, in the present memory system, as shown in FIG. 14, the cycle of the clock signal CLK of the control circuit CNTL0 may be set separately from the respective processing times of the stages of the pipeline because the clock signal CLK of the control circuit is only used to deliver data stored in the buffer $BF_0$ to the control circuit CNTL0 and is not related to the pipeline operation of the memory block Bi. However, it is to be noted that the time taken from the start of the internal processing of the memory block Bi to the acquisition of the first data by the control circuit CNTL0 is required to be set at a value exceeding a given value. For example, when four serial data 1–4 are delivered from the memory block Bi to the control circuit CNTL0, the start timing of processing using data 1 by the control circuit CNTL0 is required to be determined such that the control circuit CNTL0 fetches data 4 synchronously with the clock signal CLK without waiting. This means that the data 4 has already been delivered from the memory block Bi to the buffer BF0 when CNTL0 fetches data 4. Another advantage is that the time taken for completing the processing for the first data in the conventional memory system is about three times the processing time of the longest stage of the pipeline when the pipeline is composed, for example, of three stages, whereas the corresponding time is reduced to the sum of the respective processing times of the three stages of the pipeline in the present memory system. Thus, in the inventive memory system, the time taken for completing the processing for data 1 to 4, for example, is reduced correspondingly compared to the conventional memory system.

As will be obvious from the above description, the operation of the buffer BF0 of the present memory system is quite different the concept of the conventional cache memory in the following two points:

(1) The register of the buffer BF0 has an input and output, and the input and output operations of the register are performed simultaneously in parallel. In contrast, the writing and reading operations cannot be performed simultaneously in the cache memory. Thus, the present memory system minimizes the time in which data from the memory array block Bi stays in the buffer BF0, so that data from the memory array block Bi passes through the buffer BF0 without a substantial delay. Thus, the buffer BF0 used in the present memory system is intended to operate synchronously with the external device, while making the best of the high-speed operation of the memory block Bi; and (2) The buffer BF0 does not operate so as to store and output data collectively unlike a cache memory, but modulates the transfer rate of serial data. Thus, as mentioned above, even if the capacity of the buffer BF0 is much less than the number of data to be transferred, data is transferred without intermission at high speed from the memory array block to the external device at clocks from the external device.

BRIEF DESCRIPTION OF THE DRAWINGS

FIG. 13 shows operation waveforms indicating that distribution of clock delays in the system do not influence the clock frequency in the memory system according to the present invention;

FIG. 14 shows operation waveforms indicating that uneven processing times in the longest stage of a pipeline applied to the memory array blocks of the memory system do not influence the clock frequency according to the present invention;

DETAILED DESCRIPTION OF THE PREFERRED EMBODIMENTS

Some preferred embodiments of a memory system according to the present invention will be described below in more detail with reference to the accompanying drawings.

<Embodiment 1>

Figure 1:
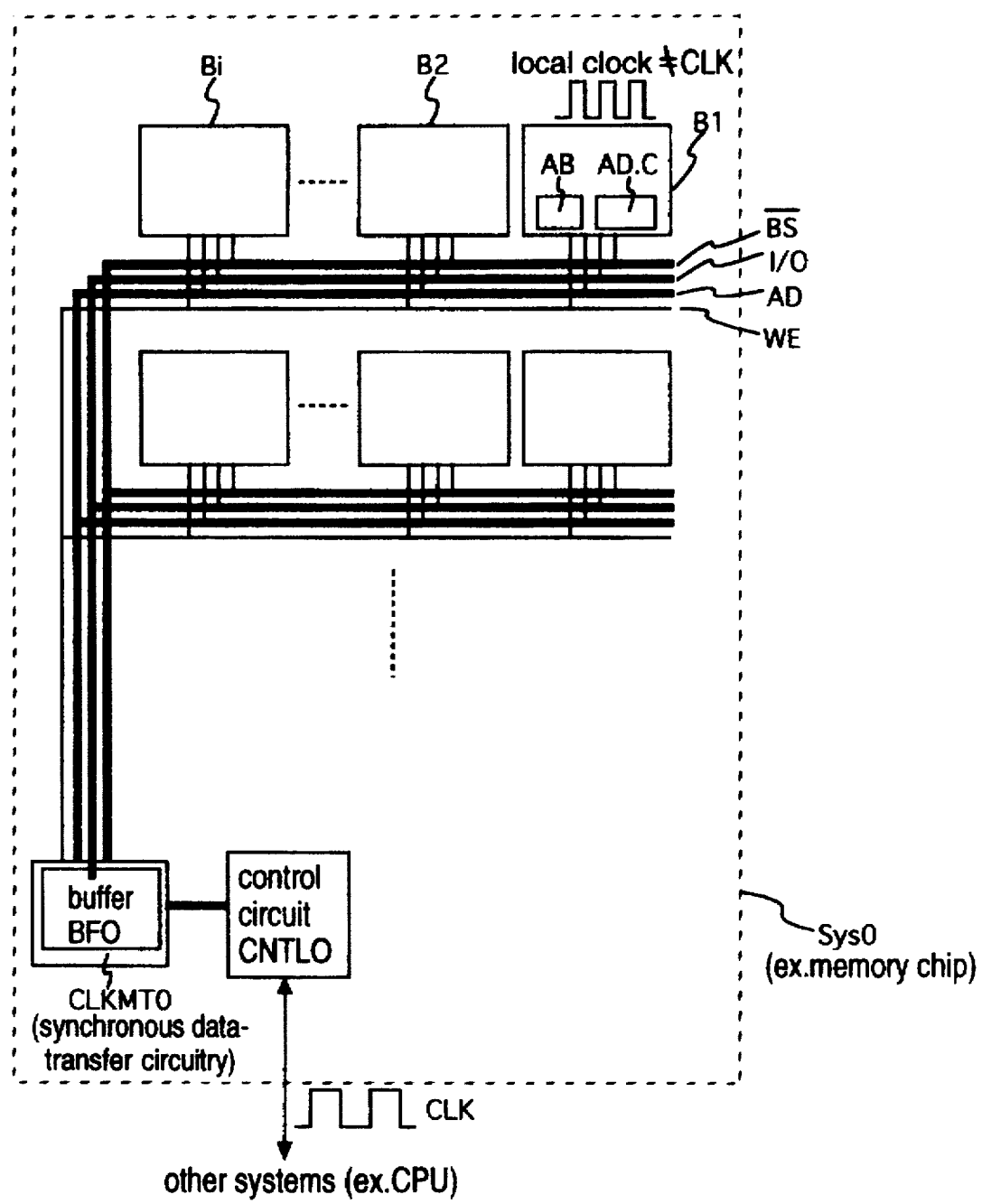
FIG. 1 is a block diagram indicative of an essential portion of one embodiment of a memory system according to the present invention.

FIG. 1 is a block diagram indicative of an essential portion of one embodiment of a memory system according to the present invention where the memory blocks operate in their respective local clock cycles, but operate synchronously as a whole. Application of the present memory system to a memory chip composed of a plurality of memory array blocks will be described hereinafter. This also applies to an electronic device composed of a CPU and a plurality of memory chips as well.

In FIG. 1, a memory system, here a memory chip Sys0, is composed of a plurality of memory array blocks Bi (i=1, 2, 3, ...) which each output a series of data serially at its local clock cycle, synchronous data-transfer circuitry CLKMT0, including at least a buffer BF0, for adjusting the output timing of a series of data incoming serially through a complementary data-line pair I/O from each memory array block Bi so as to be synchronized with a clock signal CLK of an external device, for example a CPU, and a control circuit CNTL0 which is an input/output interface to/from the external device.

Figure 18:
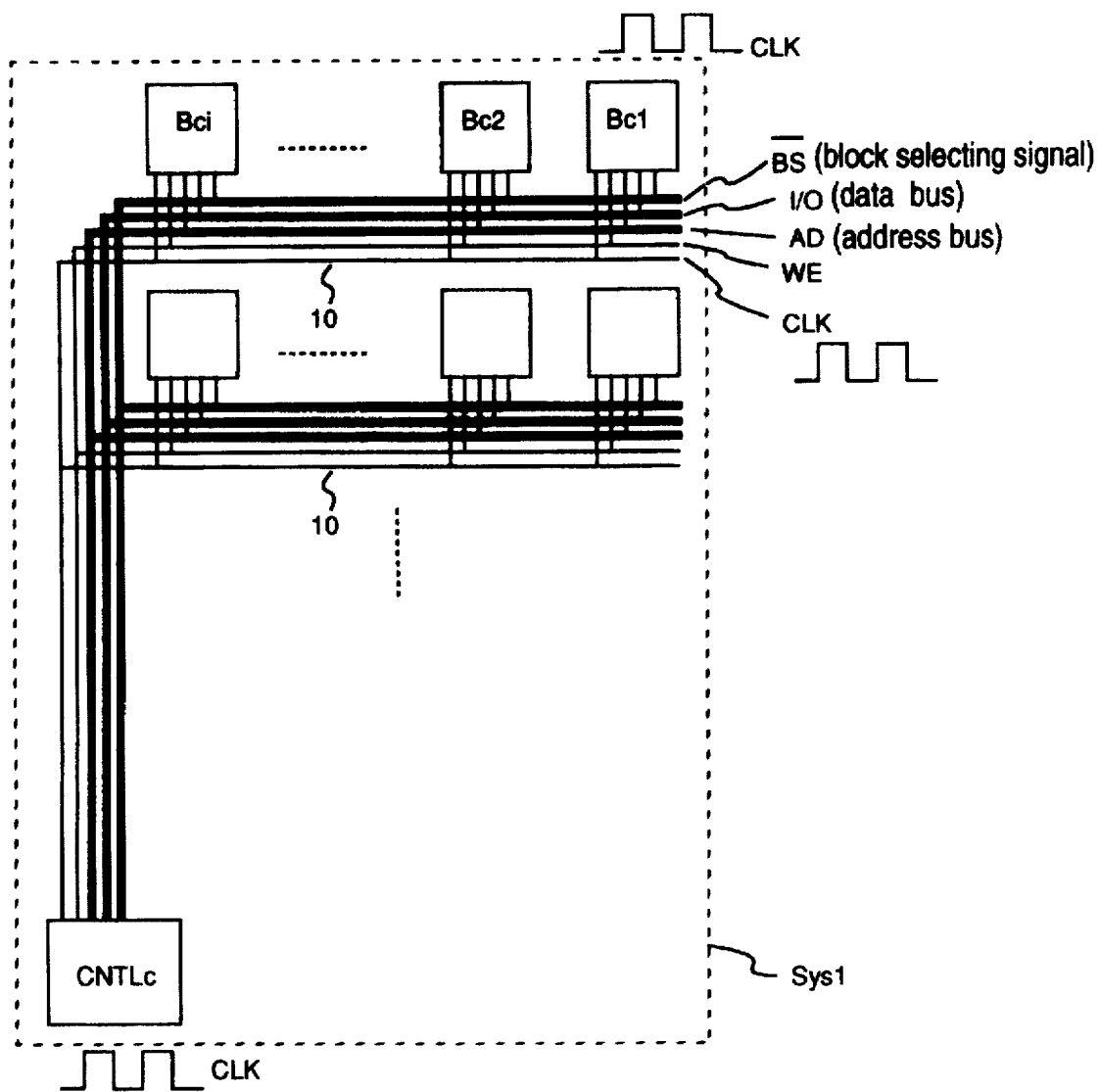
FIG. 18 is a block diagram indicative of an essential portion of a conventional memory system controlled synchronously with a single clock.
Figure 19:
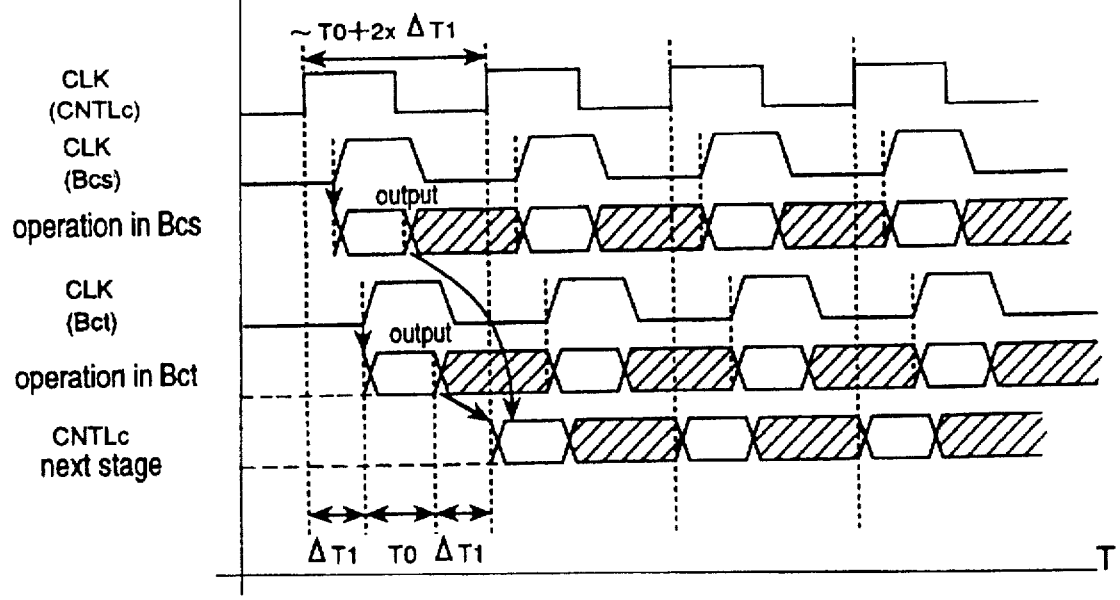
FIG. 19 shows operation waveforms indicative of a deterioration in the processing rate due to distribution of clock delays in the conventional memory system of FIG. 18.
Figure 20:
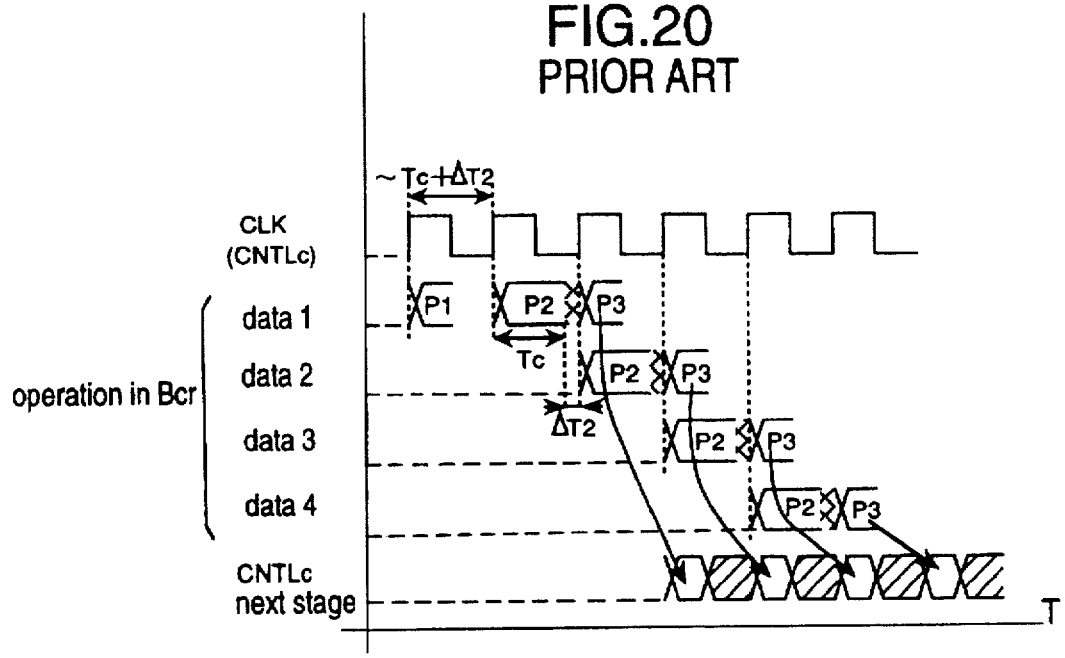
FIG. 20.shows operation waveforms indicating influence of uneven processing times in the longest stage of a pipeline applied to the memory array blocks of the conventional memory system of FIG. 18 on the clock frequency.

An interface composed of an address buffer AB and an address counter AD.C is provided in each memory array block Bi. The control circuit CNTL0 and the memory array blocks Bi are connected by a block select signal $\overline{BS}$ line, complementary data-line pair I/O, address bus AD, and write enable signal WE line. In the arrangement of the present embodiment, clock signal lines such as those shown by 10 in the conventional example of FIG. 18 are not distributed to the memory array blocks Bi.

The operation of the memory system of the present embodiment will be described below.

First, assume that one of the memory array blocks Bi, say B1, is selected with a block select signal $\overline{BS}$. The operation in which a series of data is transferred from the memory array block B1 through the synchronous data-transfer circuitry CLKMT0 and the control circuit CNTL0 to the external device or CPU (that is, readout operation from the memory chip Sys0) is performed as follows. Once an initial address is given from the CPU through the control circuit CNTL0 to the address buffer AB of the selected memory array block B1, the memory array block B1 starts outputting a series of data one after another at its local clock cycle while counting up its internal address counter AD.C. The synchronous data-transfer circuitry CLKMT0 temporarily stores the incoming series of data in its internal buffer BF0 for adjusting the output timing and outputs the series of data to the outside at given cycles (generally, the cycle of the CPU) given by the control circuit CNTL0. During the temporary storage of the incoming data in the buffer BF0, the synchronous data-transfer circuitry also outputs its stored data one after another. This means that the function of the synchronous data-transfer circuitry is to modulate the data transfer rate, which is different from the function of a cache memory which is to store incoming data collectively for a while and then output the stored data by request.

When the operation frequency of the internal clock signal of the memory array block B1 is high compared to the clock signal CLK of the CPU, data transfer can continue without filling up the buffer BF0 as long as the storage capacity of the buffer BF0 is larger than the number of serial data to be transferred. In fact, even if the storage capacity of the buffer BF0 is smaller (for example, of n bits), data transfer can continue in a manner to be described next.

When the local cycle of the memory array block B1 is shorter than that of the clock signal CLK of the CPU, continuous transfer of data would fill up the buffer BF0 soon. In order to avoid this situation, the control circuit CNTL0, first of all, requires only a part of serial data equal in bits to the storage capacity of the buffer BF0, say n bits, from the memory array block B1. After the cycles required for processing the n bits of serial data, the control circuit CNTL0 requires only another part of serial data of n bits starting from the n-added address in the memory array block B1. By repetition of this operation, even consecutive data having any length exceeding the storage capacity of the buffer B0 is transferred normally without intermission.

Figure 2:
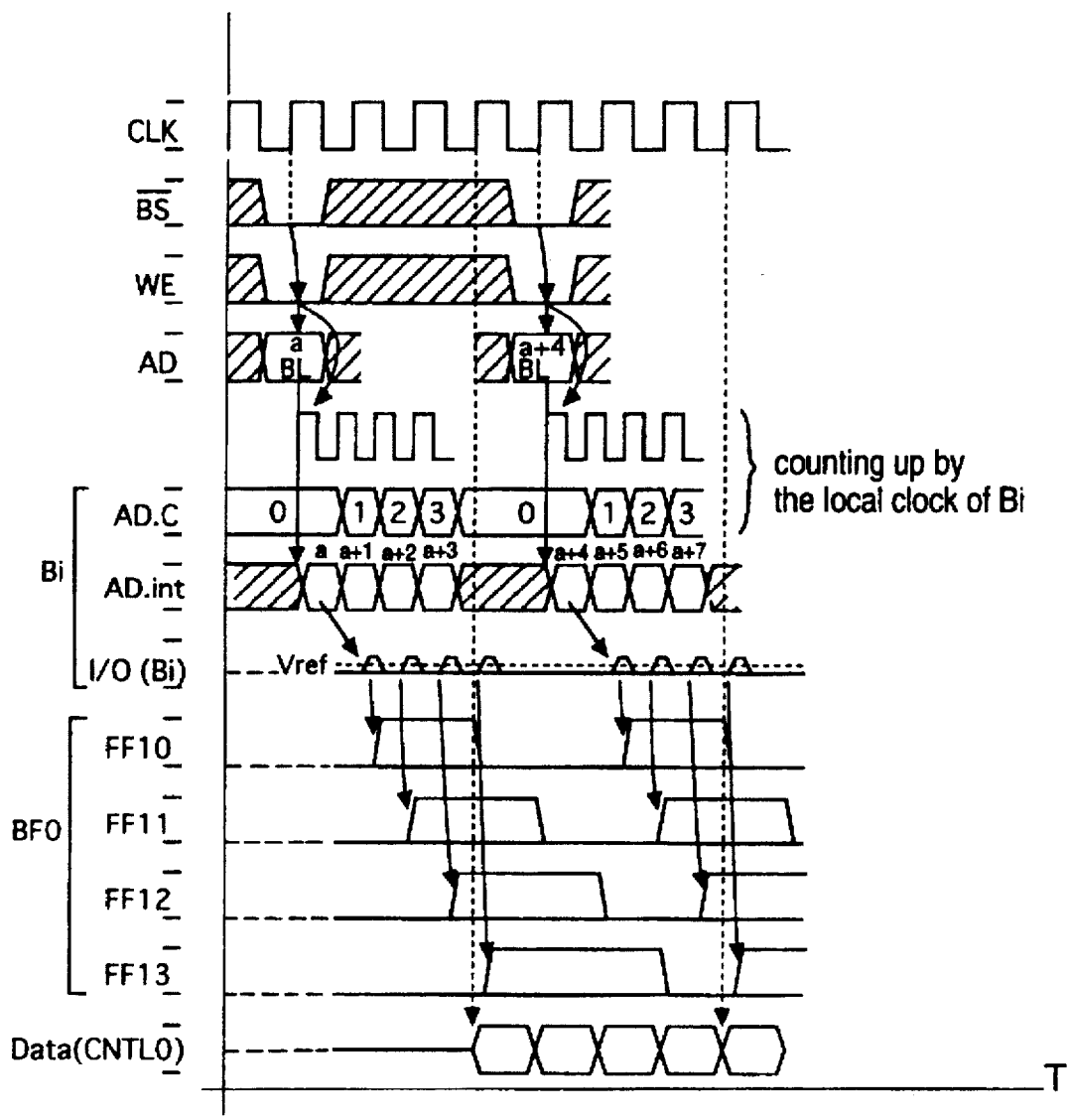
FIG. 2 shows operation waveforms indicative of one example of data transfer from a memory array block Bi to a control circuit CNTL0 in the memory system of FIG. 1.

FIG. 2 shows operation waveforms indicating data transfer from a memory array block Bi to the control circuit CNTL0 in the memory system Sys0 of FIG. 1. The data transfer will be described in more detail, using FIG. 2. First, synchronously with the clock signal CLK of the control circuit CNTL0, a block select signal $\overline{BS}$ is transferred from the control circuit CNTL0 to the respective memory array blocks to thereby select a desired memory array block Bi, which then starts its operation in response to the selection.

At this time, since a write enable signal WE from the control circuit CNTL0 is low in level, the selected memory array block Bi recognizes that the operation mode is data transfer from the selected memory block Bi to the control circuit CNTL0. The selected memory array block Bi also recognizes an initial address "a" and the number BL of required data in serial address which are given through the address bus AD by the control circuit CNTL0 at this time. When the BL exceeds the capacity (for example four) of the buffer BF0, the control circuit CNTL0, first of all, designates four as the BL.

The address counter AD.C of the memory array block Bi has an initial value of 0. The internal address AD.int of the memory array block Bi is set at "$\underline{a}$" on the basis of the initial value of 0 of the address counter AD.C and the initial address "$\underline{a}$" transferred to the address buffer AB. As a result, data having the address "$\underline{a}$" is output from the memory array block Bi to the complementary data-line pair I/O after having being subjected to the internal processing of the memory array block. The address counter AD.C counts up from 0 to 3 at the internal cycle (generally, shorter than the cycle of the clock signal CLK of the CPU) of the memory array block Bi. In response to this operation, the address AD.int in the memory array block Bi changes incrementally from "a" to "a+3". The four serial data from addresses "a" to "a+3" are output one after another from the memory array block Bi to the complementary data-line pair I/O.

Since the buffer BF0 of 4 bits is provided in the synchronous data-transfer circuitry CLKMT0 disposed in the vicinity of the control circuit CNTL0, the incoming serial data from the selected memory array block Bi is delivered in a cyclic manner to the four flip-flops FF1i (in the case of FIG. 2, i=0, 1, 2 and 3) in the buffer BF0. The switching of the flip-flop FF1i to which the data is delivered is performed by detecting a change in the data transferred from the memory array block Bi, as will be described later. The control circuit CNTL0 sequentially receives data delivered from the memory array block Bi to the buffer BF0 synchronously with the clock signal CLK of the CPU, for example, three clocks after the designation of the data transfer in FIG. 2, and outputs the received data to the outside.

Similar operations then start with an initial address of "a+4", four clocks after the designation of the initial data transfer.

By repetition of this operation, the control circuit CNTL0 outputs a large number of data in serial address, exceeding the storage capacity of the buffer BF0 without intermission synchronously with the clock signal CLK of the CPU even when the local cycle of the array block Bi is shorter than that of the clock signal CLK of the CPU.

Since data readout is performed by the memory system Sys0 in this way, the present system has the following advantages compared to the conventional memory system of FIG. 18 where the clock signal lines 10 are distributed throughout the whole memory system:

(1) As described above with reference to FIG. 13, a high-speed readout is performed without deterioration in the processing rate due to distribution of clock delays in the system;

(2) As described with reference to FIG. 14, high-speed data readout is performed in a pipeline system without the need for allowing for a margin in considering the variation of processing times in the longest stage;

(3) Charging/discharging of the clock signal lines throughout the whole memory system is not required, resulting in reducing the current consumption;

(4) The memory system is of high reliability, i.e., free from noise resulting from high speed charging/discharging of the clock signal lines throughout the whole memory system; and (5) Since there is no need for consideration of different clock delays between the memory blocks Bi in design, the design is easy.

The storage capacity of the buffer BF0 may be of the maximum number of serial data (for example, 512 bits). However, repetitive operation for a part of serial data (in this case, of four bits) as in the present embodiment allows the small BF0 capacity, preventing increased area in the memory system Sys0, advantageously.

After the initial address "a" and the number BL of data in serial address are delivered from the control circuit CNTL0 through the address bus AD to the memory array block Bi selected by the select signal $\overline{BS}$ and the work which the memory array block Bi should perform has been informed to Bi, the selected memory array block Bi is preferably disconnected from signal lines such as the address bus AD until the work ends. By disconnection of the memory array block Bi from those signal lines, the control circuit CNTL0 is capable of beforehand giving signals to the signal lines in preparation for the next work, so that at the instant when the selected memory array block Bi has completed the series of works and again connects itself to the signal lines, it can start its next work. As a result, deterioration in the processing rate due to the time taken for the signal lines to be charged/discharged is avoided.

Figure 3:
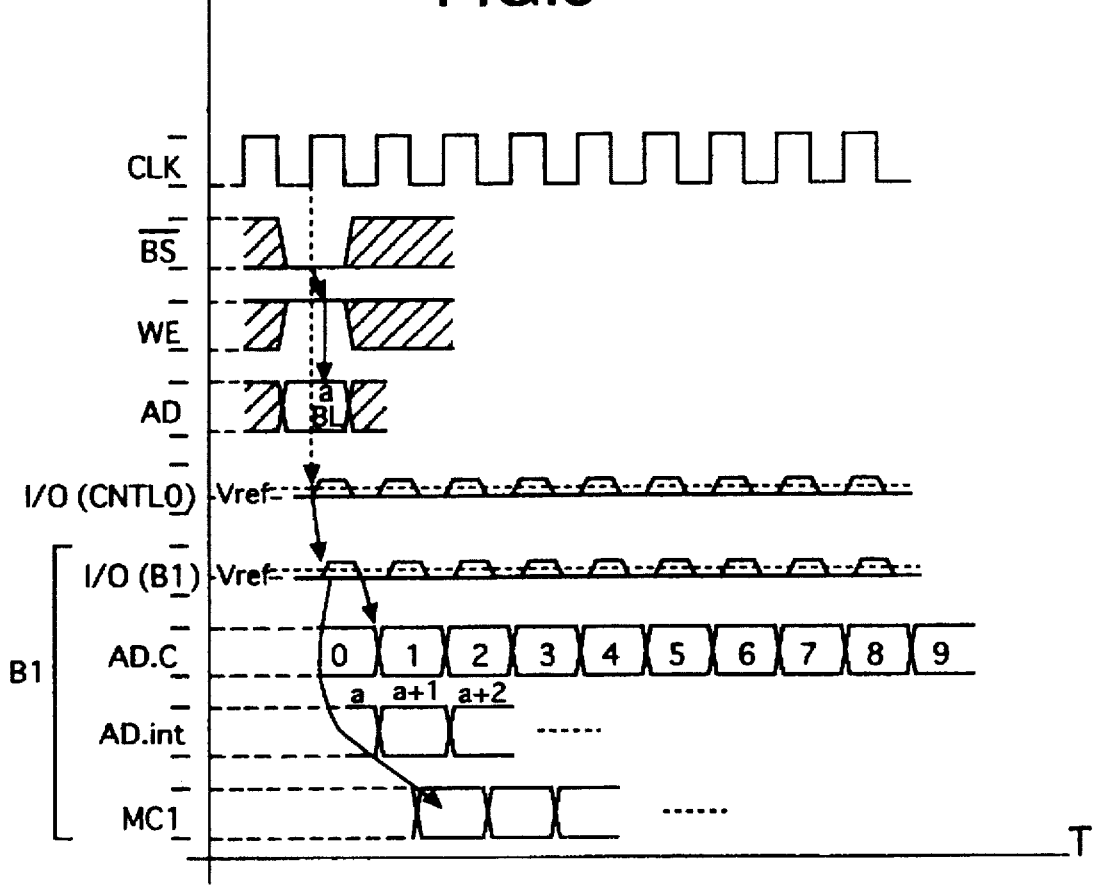
FIG. 3 shows operation waveforms indicative of one example of data transfer from the control circuit CNTL0 of the memory system of FIG. 1 to a selected memory array block B1.

Reverse transfer of data from the control circuit CNTL0 to the memory array block Bi (that is, write operation into the memory chip) in the memory system Sys0 of FIG. 1 will be described specifically with reference to FIG. 3, which shows operation waveforms indicating transfer of data from the control circuit CNTL0 to a memory array block B1, for example, selected from among the memory array blocks Bi. In this case, as described below, a local clock signal of the memory array block B1 is generated in correspondence to changes in the voltage levels of the complementary data-line pair I/O due to the transferred data. The memory array block B1 fetches data and switches the storage address, synchronously with the local clock signal.

First, assume that a block selection signal $\overline{BS}$ is delivered to the memory array block B1 synchronously with a clock signal CLK of thus the circuit CNTL0, and thus the memory array block B1 is selected. The selected memory array block B1 starts its operation in response to the block select signal $\overline{BS}$. Since the write enable signal WE from the control circuit CNTL0 is high in level, the selected memory array block B1 recognizes that the operation mode is the transfer of data from the control circuit CNTL0 to the memory array block.

The memory array block B1 recognizes the initial address "a" and the number BL of requested data in serial address delivered from the control circuit CNTL0 through the address bus AD. The internal address AD.int in the memory array block B1 is set at "a" on the basis of the initial value of 0 of the address counter AD.C and the initial address "a" transferred to the address buffer AB. When the control circuit CNTL0 delivers first complementary data to the complementary data-line pair I/O, it is stored in the storage area at the address "a" in the selected memory array block B1. The memory array block B1 detects changes in the voltage levels of the complementary data-line pair I/O to cause the address counter AD.C to sequentially count up, and stores the data in the memory cell MC1 at an address corresponding to the count of the address counter.

Since a series of data is written into the memory system Sys0 in this way, the present memory system has the following advantages compared to the conventional system of FIG. 18 which has clock signal lines 10 distributed throughout the whole memory system:

(1) Since the control circuit CNTL0 is capable of sending serial data at a rate not higher than the local processing rate of the memory array block Bi, irrespective of the distribution of clock delays in the memory system, a high-speed write operation is performed in the present memory system;

(2) Charging/discharging of the clock signal lines throughout the whole memory system is not required, resulting in low current consumption;

(3) High-reliability memory system is obtained, i.e., noise resulting from high-speed charging/discharging of the clock signal lines throughout the whole memory system is not generated; and (4) Since there is no need for consideration of possible different clock delays between the memory blocks Bi in design, the design is easy.

<Embodiment 2>

Figure 4:
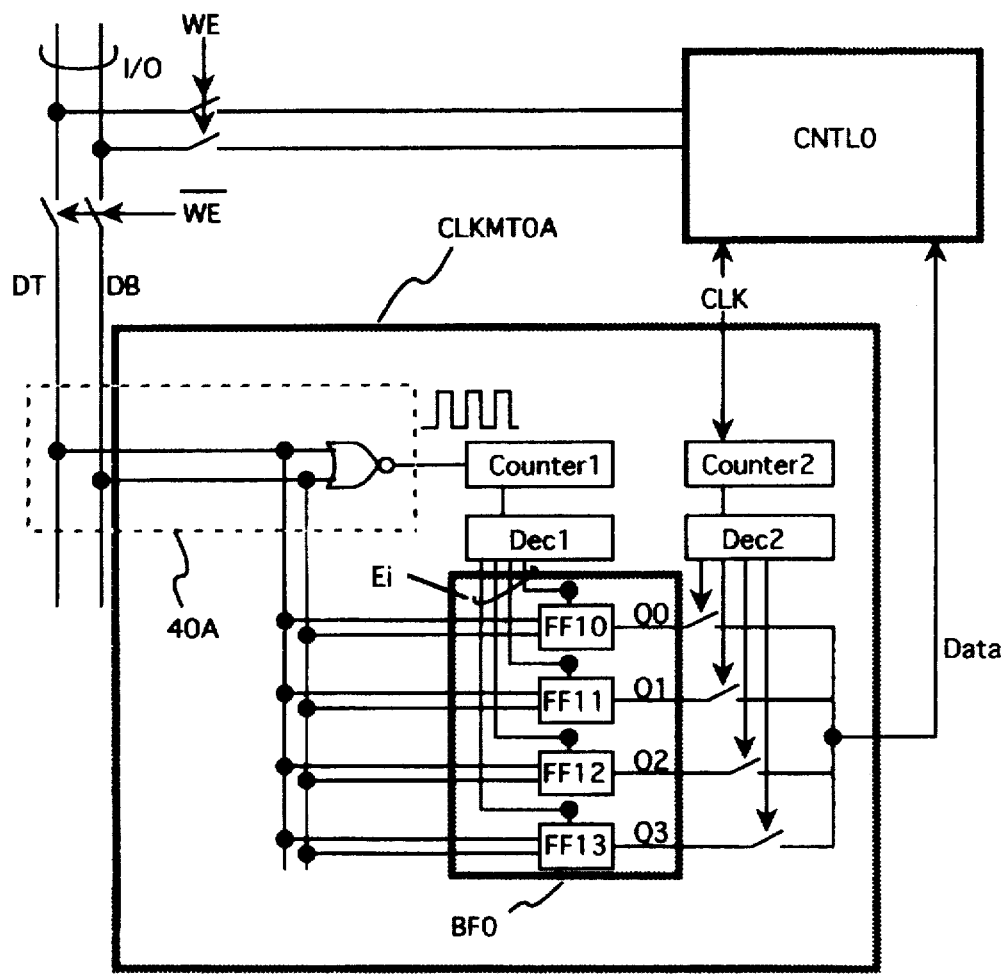
FIGS. 4(a) and 4(b) are a block diagram of one example of a specified circuit structure of the control circuit CLKMT0 of the memory system of FIG. 1 and a diagram of an alternative 40B of a circuit 40A used in FIG. 4(a), respectively.
Figure 4:
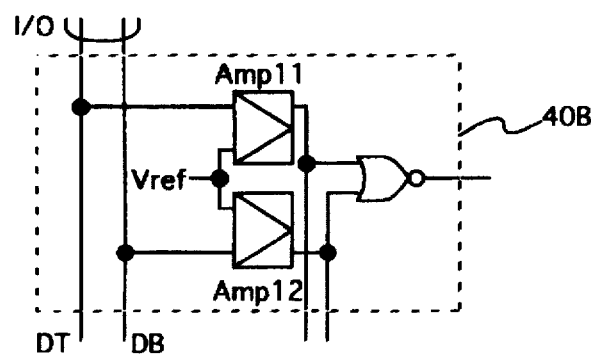
Figure 5:
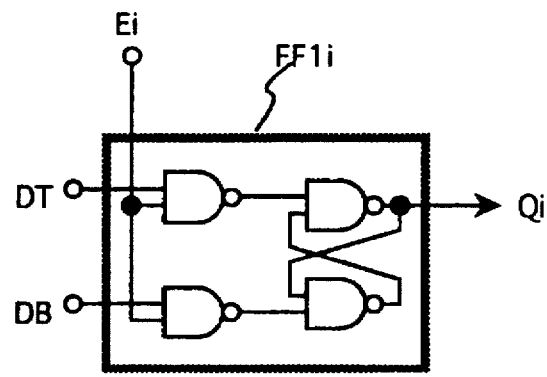
FIG. 5 is a circuit diagram indicative of an illustrative structure of a flip-flop FF1i of FIG. 4(a)
Figure 6:
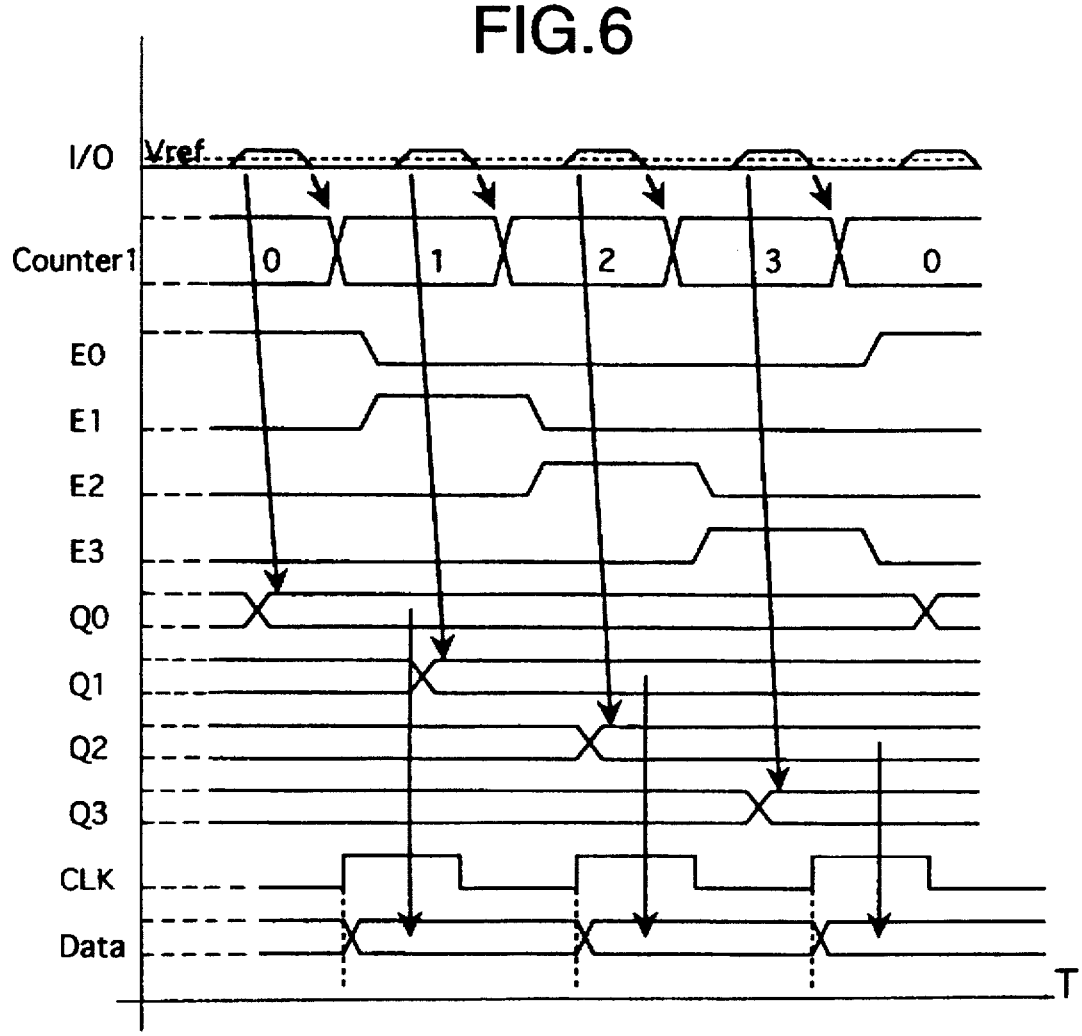
FIG. 6 shows operation waveforms indicative of one example of the internal operation of a synchronous data-transfer circuitry CLKMT0A of FIG. 4(a)

Referring to FIGS. 4–6, one embodiment of the synchronous data-transfer circuitry as a component of the present memory system of FIG. 1 will be described below. In FIG. 4(a), CLKMTOA denotes the synchronous data-transfer circuitry as a specified circuit structure of the circuit block CLKMT0 of FIG. 1. When a write enable signal WE is low in voltage level, indicating the operation mode in which a data is transferred from the memory array block Bi to the control circuit CNTL0, a data output from the memory array block Bi to the complementary data-line pair I/O is delivered through the synchronous data-transfer circuitry CLKMTOA to the control circuit CNTL0. When the write enable signal WE is high in voltage level, indicating the operation mode in which a data is transferred from the control circuit CNTL0 to the memory array block Bi, a data output from the control circuit CNTL0 is directly transferred to the complementary data-line pair I/O, not through the synchronous data-transfer circuitry CLKMTOA.

The synchronous data-transfer circuitry CLKMTOA is composed of a circuit 40A which includes an NOR gate which detects changes in the voltage levels of the pair of data lines DT, DB of the complementary data-line pair I/O and generates a pulse, a buffer BF0 which includes flip-flops FF1i (i=0–3), a counter Counter1 and a decoder Dec1 which control a data input to the buffer BF0, and a counter Counter2 and a decoder Dec2 which control a data output from the buffer BF0. The flip-flop FF1i may be, for example, composed of RS flip-flops including four NAND gates with clock pulse input terminals, for example, as shown in FIG. 5.

Referring to FIG. 6, which shows the internal operation waveforms of the synchronous data-transfer circuitry CLKMTOA, the internal operation of the synchronous data-transfer circuitry CLKMTOA will be described. As shown in FIG. 6, the data lines DT, DB of the complementary data-line pair I/O are normally low in voltage level compared to a reference potential Vref. As a data is transferred from a selected memory array block Bi, any one of the data lines DT, DB becomes high in voltage level. At this time, in correspondence to the fact that only one E0 of four output lines Ei of the decoder Dec1 is high in voltage level, a data is fetched by a flip-flop FF10 of the buffer BF0 and is output from a Q0 terminal of the flip-flop FF10. When the data lines DT, DB of the complementary data-line pair I/O return to their low voltage level, the output of the NOR gate of the circuit 40A rises and the counter Counter1 counts up from 0 to 1. As a result, the output line E0 of the decoder Dec1 becomes low in voltage level and the output line E1 becomes high in voltage level. The next data delivered from the memory array block Bi is fetched by a flip-flop FF1i of the buffer BF0. In this way, the data delivered from the memory array block Bi is fetched in a cyclic manner by the flip-flop FF1i.

Outputting data from the flip-flop FF1i of the buffer BF0 is performed synchronously with a clock signal CLK from the control circuit CNTL0. By this clock signal CLK, the counter Counter2 is caused to sequentially count up and the flip-flop FF1i of the buffer BF0 is connected cyclically one at a time to the control circuit CNTL0 by the decoder Dec2.

By such operations of the synchronous data-transfer circuitry CLKMTOA, the control circuit CNTL0 is capable of receiving data synchronously with the clock signal CLK even when data is transferred from the memory array block Bi at a local cycle that is shorter than that of the clock signal CLK from the control circuit CNTL0. That is, according to this embodiment, even when the local cycle of the memory array block Bi is asynchronous with and shorter than the clock signal CLK of the external device in the memory system Sys0 of FIG. 1, the transfer of data is performed in a synchronous manner as a whole. The memory system Sys0 of this embodiment has advantages similar to those of the embodiment of FIG. 2 in contrast to the conventional memory system Sys1 of FIG. 18 which has the clock signal CLK lines 10 distributed throughout the whole memory system.

As shown in FIG. 4(b), the circuit 40A of the synchronous data-transfer circuitry CLKMTOA may have differential amplifiers Amp11 and Amp12, each of which has a reference voltage Vref as one of the inputs thereof, between the complementary data-line pair I/O and the NOR gate.

This circuit allows reducing the amplitude of the complementary data-line pair I/O in the data transfer from the memory array block Bi. As a result, the current consumption due to charging/discharging of the complementary data-line pair I/O is reduced further.

<Embodiment 3>

Figure 7A:
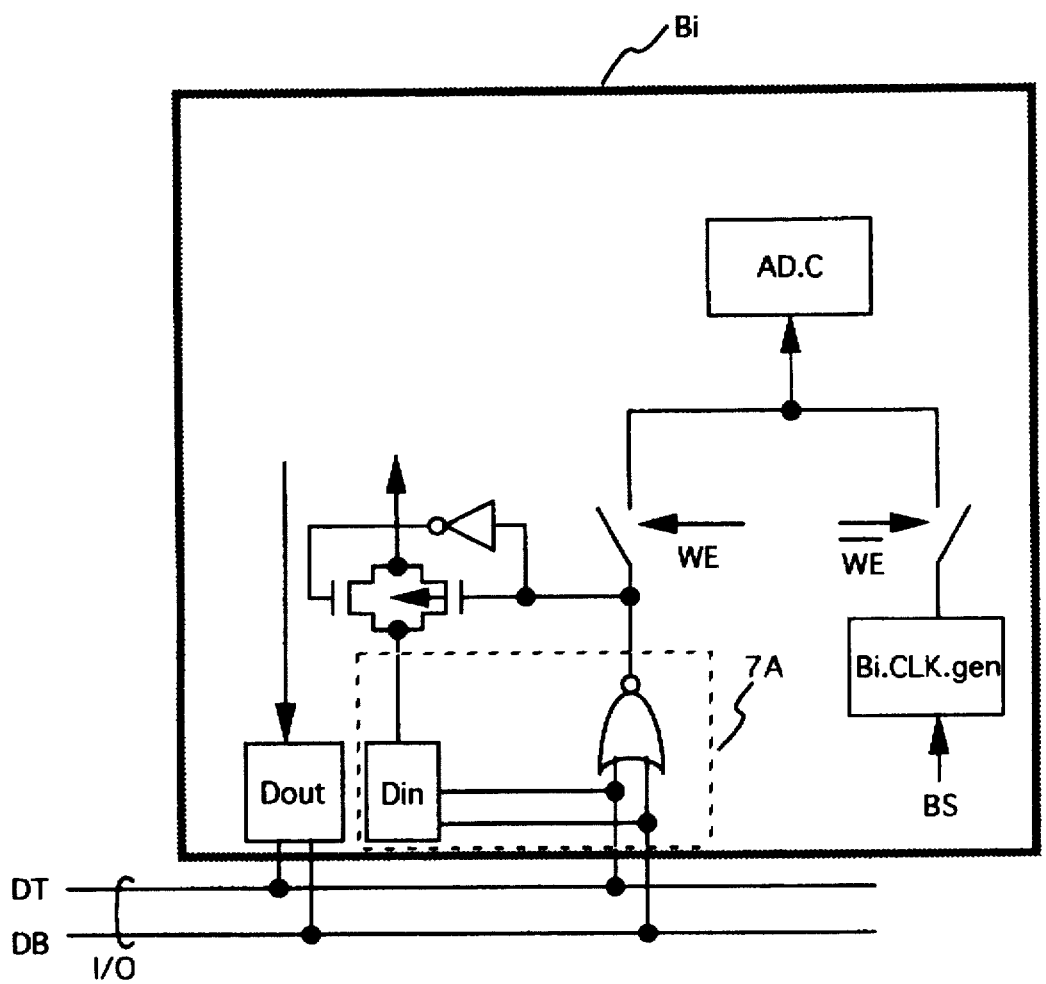
FIGS. 7(a) and 7(b) are a block diagram of an essential portion of one example of an interface of a memory array block $B_i$ of FIG. 1 and a circuit diagram of an alternative 7B of a circuit 7A in FIG. 7(a), respectively.
Figure 7B:
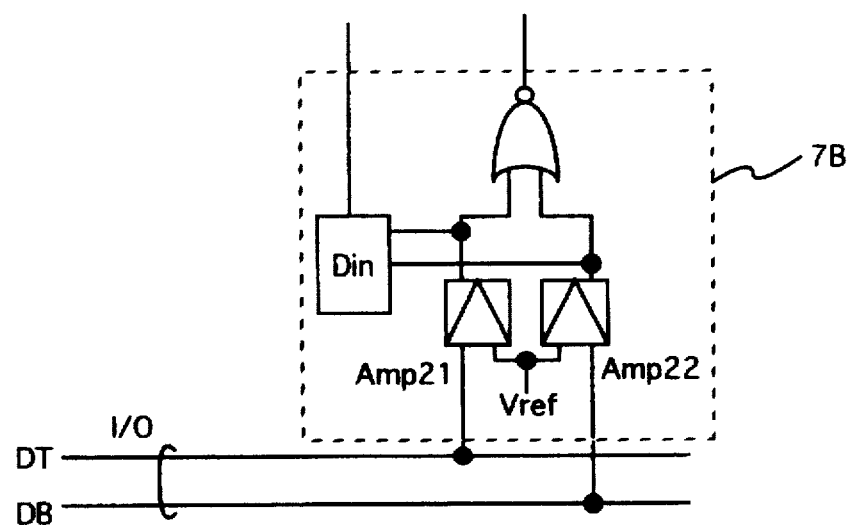

Referring to FIGS. 7(a) and 7(b), one embodiment of the interface for the memory array blocks Bi which are part of the components of the present memory system of FIG. 1 will be described next. In the interface of this embodiment, one pulse source which causes the address counter AD.C to count up is selected in dependence on the state of a write enable signal WE. In FIG. 7(a), Bi.CLK.gen denotes a clock generator of the memory array block Bi. When the write enable signal WE is low in voltage level, indicating a data should be transferred from the memory array block Bi to the control circuit CNTL0, the internal clock generator Bi.CLK-.gen becomes a pulse source. When a desired memory block Bi is selected by a block select signal $\overline{BS}$, the internal clock generator Bi.CLK.gen of the selected memory array block Bi starts its operation to cause the address counter AD.C to count up at its local clock cycle.

In contrast, when the write enable signal WE is high in voltage level, indicating data should be transferred from the control circuit CNTL0 to the memory array block Bi, changes in the voltage levels of the complementary data-line pair I/O along with data transfer are detected and a corresponding pulse is generated to cause the address counter AD.C to count up. More specifically, when data lines DT, DB of the complementary data-line pair I/O, one of which is high in voltage level and the other of which is low in voltage level, return to a standby state, where the pair of lines DT, DB are at the same voltage level, the output of the NOR gate of the input unit 7A rises to thereby turn off a pair of switching transistors provided between the memory array (not shown) and the input buffer Din, and also causes the address counter AD.C to count up. In correspondence to the next data-transfer, one of the data lines DT, DB of the complementary data-line pair I/O is high and the other is low, in voltage level in response to the data. Thus, the output level of the NOR gate drops and the switching transistor connected to the input buffer Din is turned on. At this time, the address counter AD.C has already been counted up and hence the received data is stored at the next address.

As described above, according to the present embodiment, since the array block Bi operates at its local cycle when a data is transferred from the memory array block Bi to the control circuit CNTL0, the design of the memory array block Bi is closed in this block to thereby facilitate the design, advantageously. When the memory array block B1 is operated in a pipeline system, the local clock generator Bi.CLK.gen may be a self-synchronous clock generator in which, the start of the processing of one stage is triggered by the end of the processing of the preceding stage. Thus, a self-synchronous pipeline system is constructed, so that the processing rate of the system is increased advantageously. Furthermore, clock signal lines are not required to be distributed throughout the whole system, so that an increase in the current consumption and generation of noise caused by the charging/discharging of the clock signal lines are avoided, advantageously.

As shown in FIG. 7(b), in place of the input unit 7A, an input unit 7B may be provided where a pair of differential amplifiers Amp21, Amp22, each of which receives a reference voltage Vref as one input, may be provided between the complementary data-line pair I/0 and the NOR gate such that the differential amplifiers Amp21, Amp22 detect and amplify changes in the voltage levels of the pair of data lines DT, DB of the complementary data-line pair I/O to thereby cause the NOR gate to generate a pulse. In this case, the amplitude of the complementary data-line pair I/0 is reduced and therefore the current consumption caused by the charging/ discharging of the complementary data-line pair I/O are reduced, advantageously. <Embodiment 4>

Figure 8:
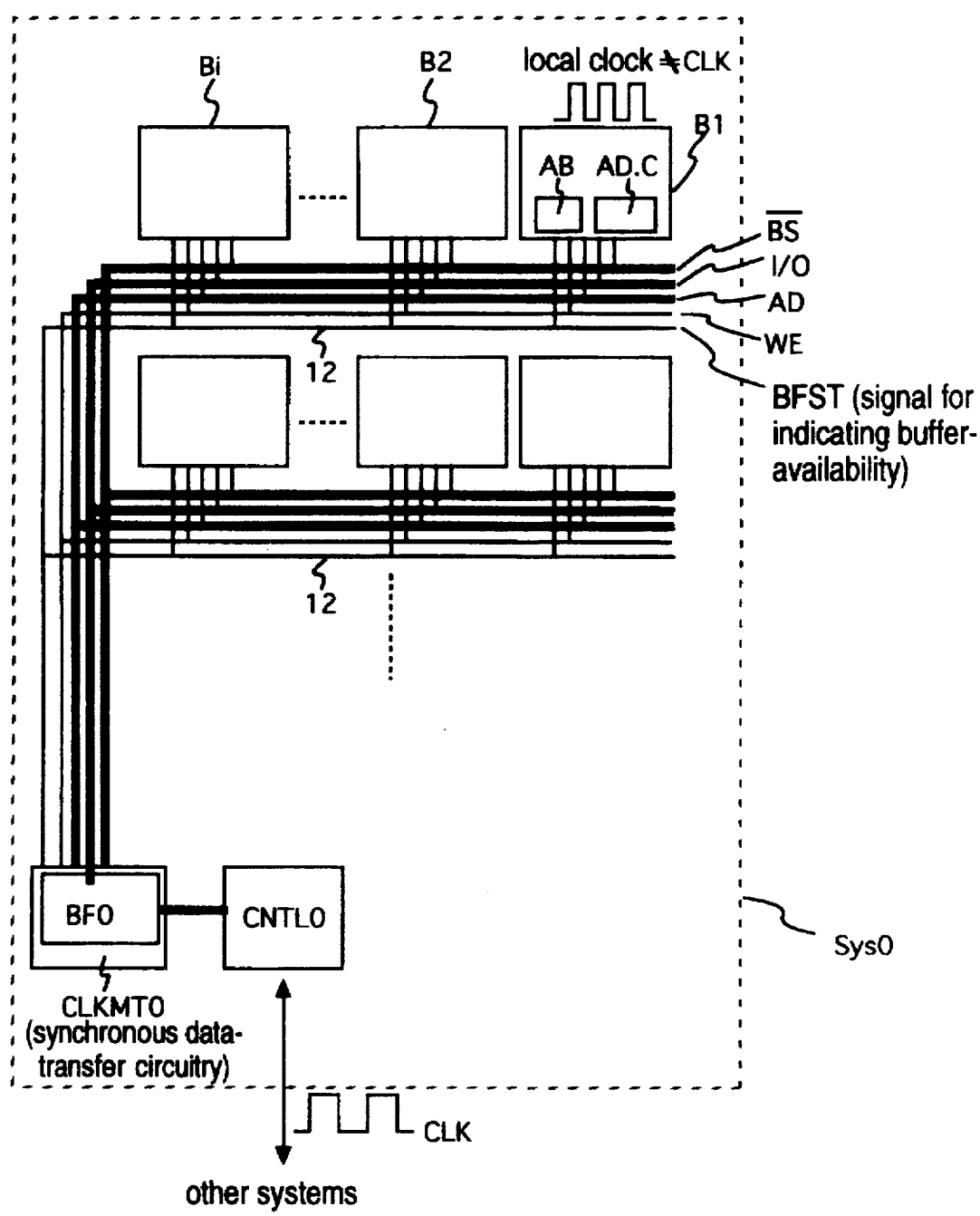
FIG. 8 is a block diagram of an essential portion of another embodiment of the memory system according to the present invention.

FIG. 8 is a block diagram indicative of an essential portion of the memory system according to another embodiment of the present invention where the respective memory blocks operate at their respective local clock cycles and synchronously as a whole. In the present embodiment, application of the present memory system to a memory chip composed of a plurality of memory array blocks will be described. The present memory system is applicable similarly to an electronic device composed of a CPU and a plurality of memory chips as well. The memory system of FIG. 8 is different from that of FIG. 1 in a synchronous method used when a data is transferred from the memory array block Bi to the control circuit CNTL0. The resulting memory system of FIG. 8 is different in structure from that of FIG. 1 in that the memory system of FIG. 8 includes signal lines 12 which convey a signal BFST for indicating buffer-availability between the synchronous data-transfer circuitry CLKMT0 and the respective memory array blocks. By the action of the buffer-availability indicating signal- BFST, data transfer from the memory array block Bi to the control circuit CNTL0 is performed without intermission even when the memory array block Bi operates at a local cycle that is shorter than that of the clock signal from the control circuit.

The operation of the memory system will be described next. In FIG. 8, when a data is transferred from the memory array block Bi to the control circuit CNTL0, the memory array block Bi transfers data at its local clock cycle to the buffer BF0 of the synchronous data-transfer circuitry CLKMT0. The control circuit CNTL0 receives the data transferred from the memory array block Bi to the buffer BF0, synchronously with the clock signal CLK of the external device (for example, CPU). When the local clock cycle of the memory array block Bi is shorter than the clock signal CLK of the control circuit CNTL0, consecutive transfer of data to the buffer BF0 will fill up the buffer BF0 quickly. At this time, the voltage level of the buffer-availability indicating signal BFST changes from low to high in voltage level to thereby stop the data transfer of the memory array block Bi temporarily. Thereafter, the data stored in the buffer BF0 continues to be delivered to the external device through the control circuit CNTL0 synchronous with the clock signal from the CPU. When the buffer BF0 becomes substantially empty, the buffer-availability indicating signal BFST changes, for example, from high to low in voltage level, so that the memory array block Bi restarts data transfer. Thus, the external device continues to get data synchronously with the clock signal CLK from the memory chip Sys0 without intermission. The data transfer from the control circuit CNTL0 to the memory array block Bi is performed in a manner similar to that described with reference to FIG. 3 in the embodiment of FIG. 1.

Figure 9:
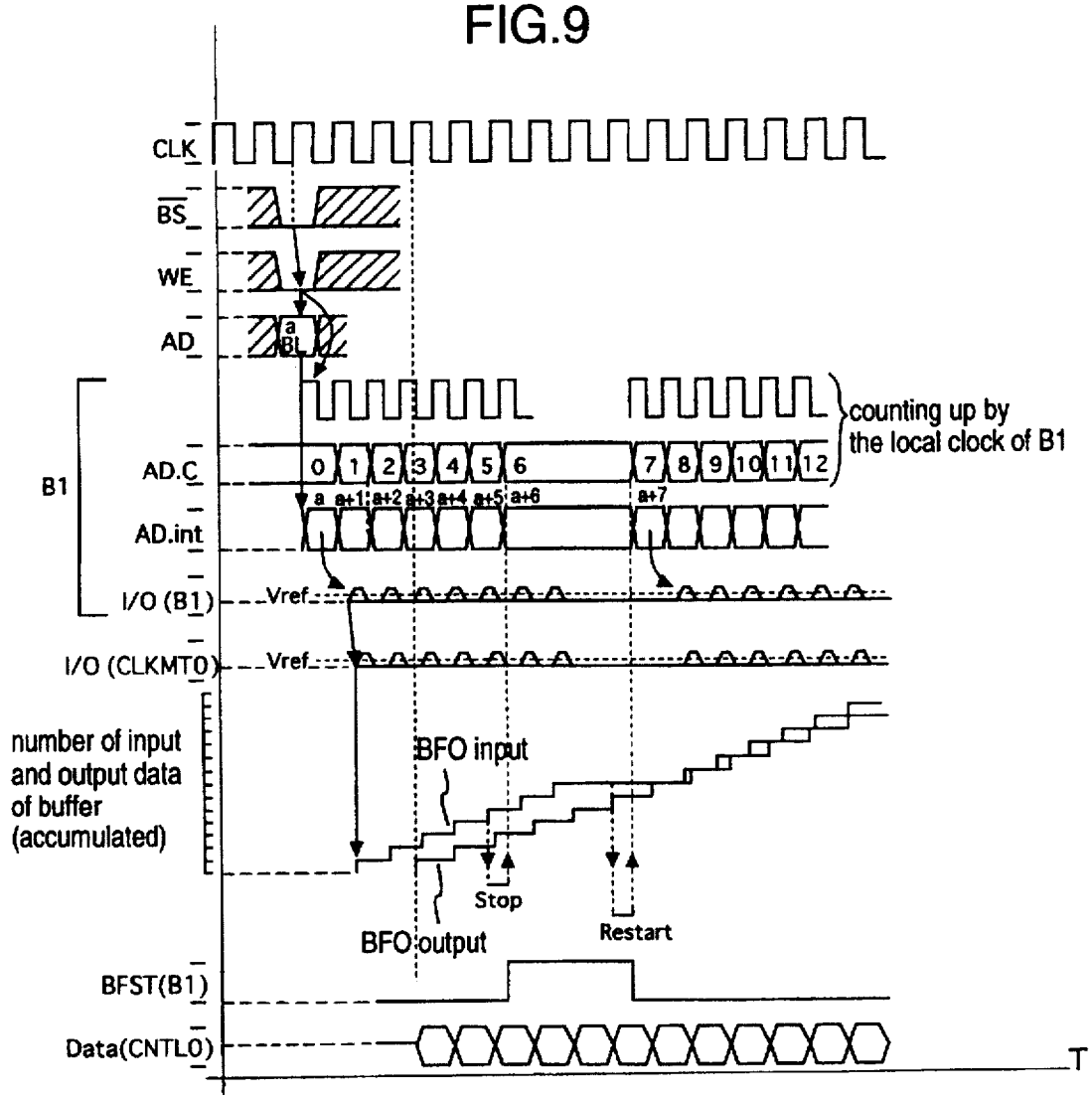
FIG. 9 shows operation waveforms indicative of one example of data transfer from a memory array block $B_j$ to a control circuit CNTL0 in the memory system of FIG. 8.

Referring to FIG. 9, which shows the operation waveforms, one example of data transfer from the memory array bock Bi of the memory system of FIG. 8 to the control circuit CNTL0 will be described specifically, using the buffer-availability indicating signal BFST.

First, synchronously with the clock signal CLK of the control circuit, a block select signal $\overline{BS}$ is delivered to a desired memory block Bi for selecting purposes. Assume now that the memory array block Bi of FIG. 8 is selected. The selected memory array block Bi receives the block select signal $\overline{BS}$ a given time thereafter to start its operation. An initial address "$\underline{a}$" and the number BL of required data in serial address or a burst length of the serial data are delivered to the selected memory array block through the address bus AD. The transfer of data from the memory array block B1 to the control circuit CNTL0 is designated by the state of the write enable signal WE (in this case, since the signal WE is low in voltage level). The memory array block B1 has an address buffer AB and an address counter AD.C therein with the address counter AD.C being set at 0 initially. The internal address AD.int is set at "$\underline{a}$" on the basis of the initial value of 0 of the address counter AD.C and the initial address "$\underline{a}$" transferred to the address buffer AB. After the internal processing of the memory array block B1, the memory array block B1 outputs one of the data on the address "$\underline{a}$" to the complementary data-line pair I/O. At this time, the address counter AD.C counts up at its internal clock cycle and accordingly, the internal address AD.int sequentially changes, so that data at addresses "$\underline{a}$", "$\underline{a+1}$", "$\underline{a+2}$" . . . are output sequentially to the, complementary data-line pair I/O at the local clock cycle of the memory array block B1. In this way, the data output to the complementary data-line pair I/O arrives at the buffer BF0 of the synchronous data-transfer circuitry CLKMT0 a given delay time after the data is output to the I/O.

The control circuit CNTL0 starts data transfer from the buffer BF0 to the control circuit CNTL0 synchronously with the clock signal CLK of the CPU a few clocks after the first one of the serial data has been output to the I/O. In order to prevent the control circuit CNTL0 from starting data fetching before the data from the memory array block Bi arrives at the buffer BF0 the timing of the start of the data fetching is given as a specification to the user, of course.

As sequential transfer of data from the selected memory array block B1 advances, the buffer BF0 is filled gradually with the data where the local clock cycle of the memory array block B1 is shorter than the clock CLK of the control circuit. When the buffer BF0 is substantially full, the synchronous data-transfer circuitry CLKMT0 changes the buffer-availability indicating signal BFFT from low to high in voltage level. In the case of FIG. 9, when the difference between the accumulated data count which is input from the memory array block B1 to the buffer BF0 (which can be hereinafter referred to as the number of input data of BF0 (accumulated)) and the accumulated data count which is output from the buffer BF0 to the control circuit CNTL0 (which can be hereinafter referred to as the number of output data of BF0 (accumulated)) becomes 3, a buffer-availability indicating signal BFST (B1) of the memory array block B1 becomes high in level.

Consequently, the memory array block B1 is forced into a pause state. Since there is some delay between the arrival of the buffer-availability indicating signal BFST at the memory array block B1 and the end of the pause of the memory array block B1, the memory array block B1 can continue to deliver data for some time. In this case, the buffer-availability indicating signal BFST is required to be set high in voltage level several bits before the buffer BF0 is full completely.

As shown by the operation waveforms of Data (CNTL0) in FIG. 9, even after the memory array block B1 is put in the pause state or even when the buffer-availability indicating signal BFST (B1) becomes high in level, the control circuit CNTL0 continues to output data from the buffer BF0. Thus, the difference between the accumulated data count input to the buffer BFO and the accumulated data count output from the buffer BF0 to the control circuit decreases. When the difference decreases to a given number and the buffer BF0 becomes sufficiently empty, the synchronous data-transfer circuitry CLKMT0 restarts transfer of data from the memory array block B1 by setting the buffer-availability indicating signal BFST again low in level. In the case of FIG. 9, when the difference between the accumulated data count input to the memory array block B1 to the buffer BF0 and the accumulated data count output from the BF0 to the control circuit returns to 1, the buffer availability indicating signal BFST (B1) becomes low in level. If there is some delay before a data from the memory array block B1 again arrives at the buffer BF0, the buffer-availability indicating signal BFST is required to be low in level a few bits before the buffer BF0 becomes empty completely.

As just described above, by the action of the buffer-availability indicating signal BFST, data transfer continues to be performed normally even when the memory array block Bi operates at a higher-speed local clock signal than the clock signal CLK of the control circuit CNTL0. The termination of the data transfer is performed by detecting, in the address counter AD.C, the generation of a carry signal, the bit count of which corresponds to the number BL of required data in serial address.

Figure 10:
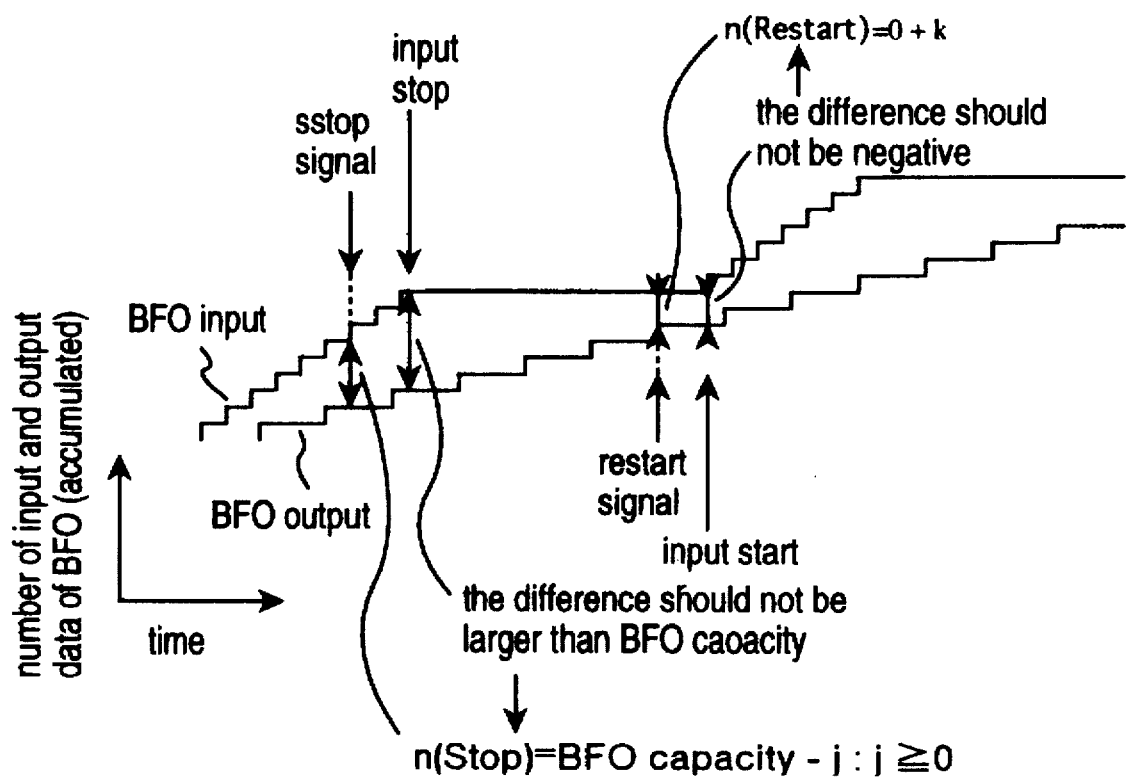
FIG. 10 illustrates a pause and restart of a memory array block Bi by a buffer-availability indicating signal BFST in the memory system of FIG. 8.

A pause and restart of readout from the memory array block Bi with the buffer-availability signal BFST will be described with reference to FIG. 10, which illustrates one example of the timing of generation of a pause signal (stop signal) and a restart signal for the memory array block Bi by the buffer-availability indicating signal BFST with the axis of abscissa representing time and the axis of ordinates representing the accumulated data count input to the buffer BF0 and the accumulated data count output from the BF0.

Even after the buffer-availability indicating signal BFST has generated a pause signal, data transfer to the buffer BF0 can continue for the time being because it takes some time for the stop signal to arrive at the memory array block Bi and it takes some time for the memory array block Bi to perform a pause operation. The difference between the accumulated data counts input to and output from the buffer BF0 (which can also be hereinafter referred to as BF0 accumulated input and output data counts) present when data transfer from the memory array block Bi to the buffer BF0 actually stops can increase further by j-bits compared to that present when the buffer-availability indicating signal BFST has generated the pause signal. Thus, the timing of the pause signal generation is required to be determined such that the number of bits representing the difference between the accumulated input and output data counts present when the data transfer actually stops is less than the capacity of the buffer BF0. That is, the number of bits (n(Stop)) representing the difference in the BF0 accumulated input and output data counts present when the pause signal is generated is required to be set at the number of bits representing the capacity of the buffer BF0 minus j-bits.

For the timing at which the buffer-availability indicating signal BFST generates a restart signal, a delay time taken for the restart signal to arrive at the memory array block Bi and a time required for data transfer to restart in the memory array block Bi are required to be considered. Also, after the generation of the restart signal, the difference between the BF0 input and output accumulated data counts can continue to decrease to be less by k-bits than when the restart signal is generated. Thus, the timing of generation of the restart signal is required to be determined such that the difference between the BF0 input and output accumulated data counts is not less than 0 immediately before the data delivered again from the memory array block Bi arrives at the buffer BF0. That is, the number of bits (n(Restart)) indicative of the difference between data counts at the time of occurrence of the restart signal is required to be set at a number not less than k-bits.

As described above, according to the present embodiment, even when the memory array block Bi operates at a local clock cycle that is shorter than that of the clock signal CLK of the control circuit CNTL0, a memory system of a semiconductor chip which operates synchronously as a whole is provided. In addition, the storage capacity of the buffer BF0 may be small and hence reduction of the size of the memory system is facilitated.

Compared to the conventional memory system which includes the clock signal lines 10 distributed throughout the whole system, as shown in FIG. 18, the memory system of this embodiment has advantages similar to those of the embodiment 1 described with reference to FIGS. 2 and 3. The charging/discharging rate per unit time of the buffer BF0 is greatly reduced compared to the charging/discharging rate of the clock signal lines 10 in the conventional memory system of FIG. 18, and invites no increases in the current consumption and noise.

<Embodiment 5>

Figure 11:
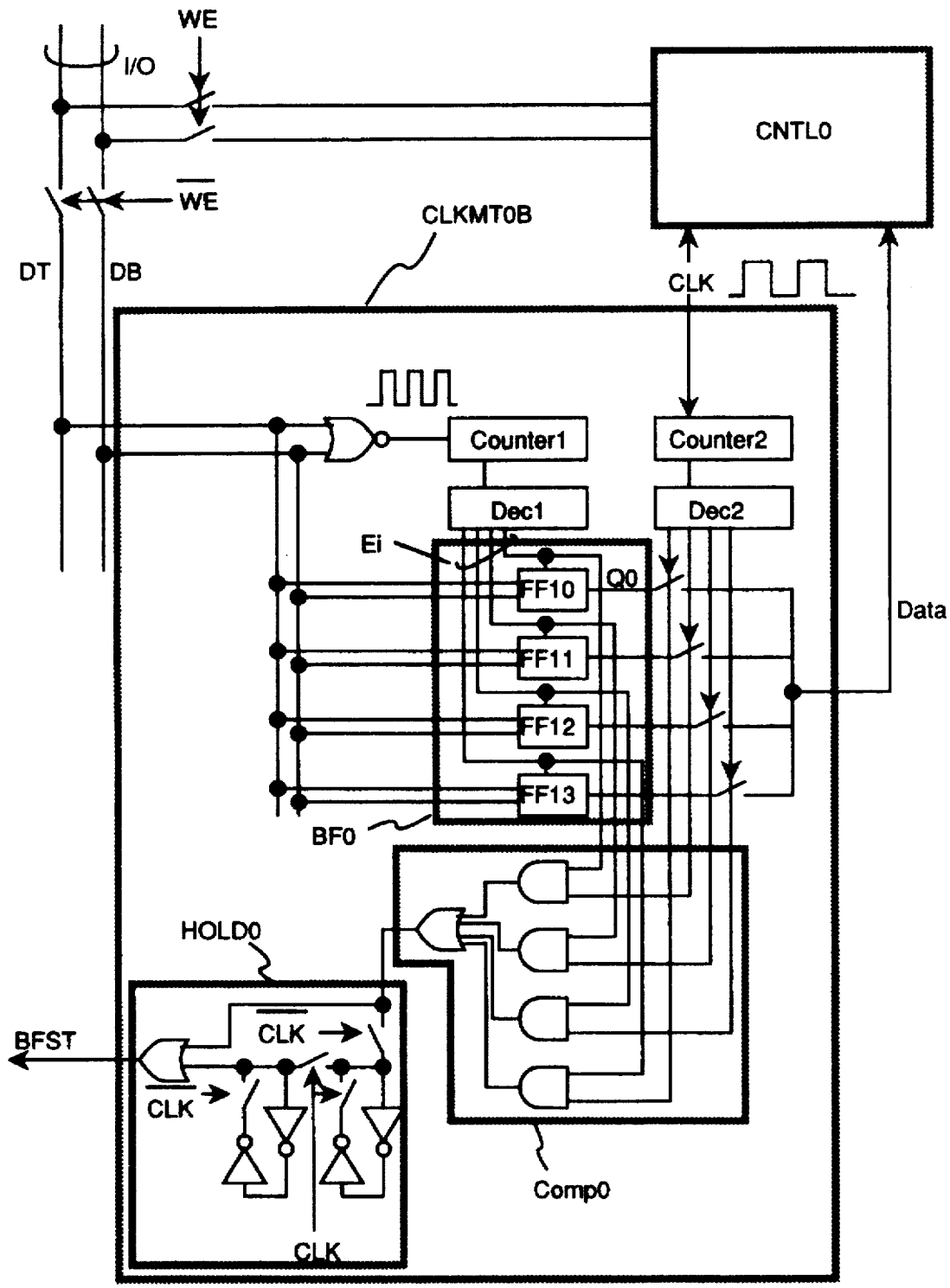
FIG. 11 is a block diagram of one example of a specified circuit structure of the synchronous data-transfer circuitry CLKMT0B of the memory system of FIG. 8.

Referring to FIG. 11, one embodiment of the synchronous data-transfer circuitry CLKMT0 which is one component of the memory system of FIG. 8 will be described next. In FIG. 11, CLKMT0B denotes synchronous data-transfer circuitry as a specified structure of the circuit block CLKMT0 of FIG. 8. It is different from the synchronous data-transfer circuit CLKMT0A of the embodiment of FIG. 4 in that it includes a combination of a logic circuit Comp0 composed of a plurality of AND gates and an OR gate; a hold circuit HOLD0 including a register composed of switches which turn on/off by a clock signal CLK, and inverters and an OR gate; and synchronous data-transfer circuitry CLKMT0A of the embodiment of FIG. 4. The logic circuit Comp0 compares the outputs of the decoders Dec1 and Dec2 to detect whether the buffer BF0 is substantially full. The hold circuit HOLD0 holds a buffer-availability signal BFST high in voltage level until the buffer BF0 returns to a substantially empty state after the BF0 becomes substantially full.

The basic operation of the synchronous data-transfer circuitry CLKMT0B is the same as that of the synchronous data-transfer circuitry CLKMT0A described with reference to the operation waveforms of FIG. 6. Thus, for convenience of explanation, its detailed description will be omitted and the operation of the additional circuits Comp and HOLD mentioned above or a method of generating a buffer-availability indicating signal BFST will be described next.

When the decoder Dec2 connects a flip-flop FF1i of the buffer BF0 to the control circuit CNTL0 and the decoder Dec1 delivers data from the memory array block Bi to the flip-flop FF1i at the next step, the logic circuit Comp0 renders the buffer-availability indicating signal BFST high in level to stop data transfer from the memory array block Bi temporarily. Thereafter, when one of the data is transferred through the control circuit CNTL0 to an external device synchronously with a clock signal CLK of the control circuit, there occurs a margin in the buffer BF0. Thus, the logic circuit Comp0 tries to return the buffer-availability indicating signal BFST again to its low level. However, by the action of the hold circuit HOLD0, the buffer-availability indicating signal BFST does not return to its low level until the clock signal CLK advances by two clocks after the buffer-availability indicating signal BFST becomes high in voltage level because the output of the logic circuit Comp0 is transferred to the register composed of the inverters and switches of the hold circuit HOLD0 to thereby hold the buffer-availability indicating signal BFST high in voltage level even one clock later. The switches may of course be composed of conventional transistor switches.

By provision of the hold circuit HOLD0, the buffer-availability indicating signal BFST is held high in voltage level until the buffer BF0 becomes substantially empty after the buffer BF0 temporarily becomes substantially full and the buffer-availability indicating signal BFST changes high in level.

While in the structure of the hold circuit HOLD0 of FIG. 11 only one register circuit is illustrated as being provided, a hold circuit HOLD0 may be formed which holds a buffer-availability indicating signal BFST high in voltage level until the clock signal CLK advances by plural clocks, in the case of obtaining the signal BFST by ORing outputs from the serially connected registers. As a result, the charging/discharging rate per unit time of the buffer-availability indicating signal BFST decreases to thereby reduce the current consumption and noise advantageously. By changing the connections of the logic circuit Comp0 and the decoders Dec1 and Dec2, the number of bits n(Stop) indicative of the difference between the BF0 accumulated data input and output counts present when the pause signal described with reference to FIG. 10 is generated is settable at any value.

<Embodiment 6>

Figure 12:
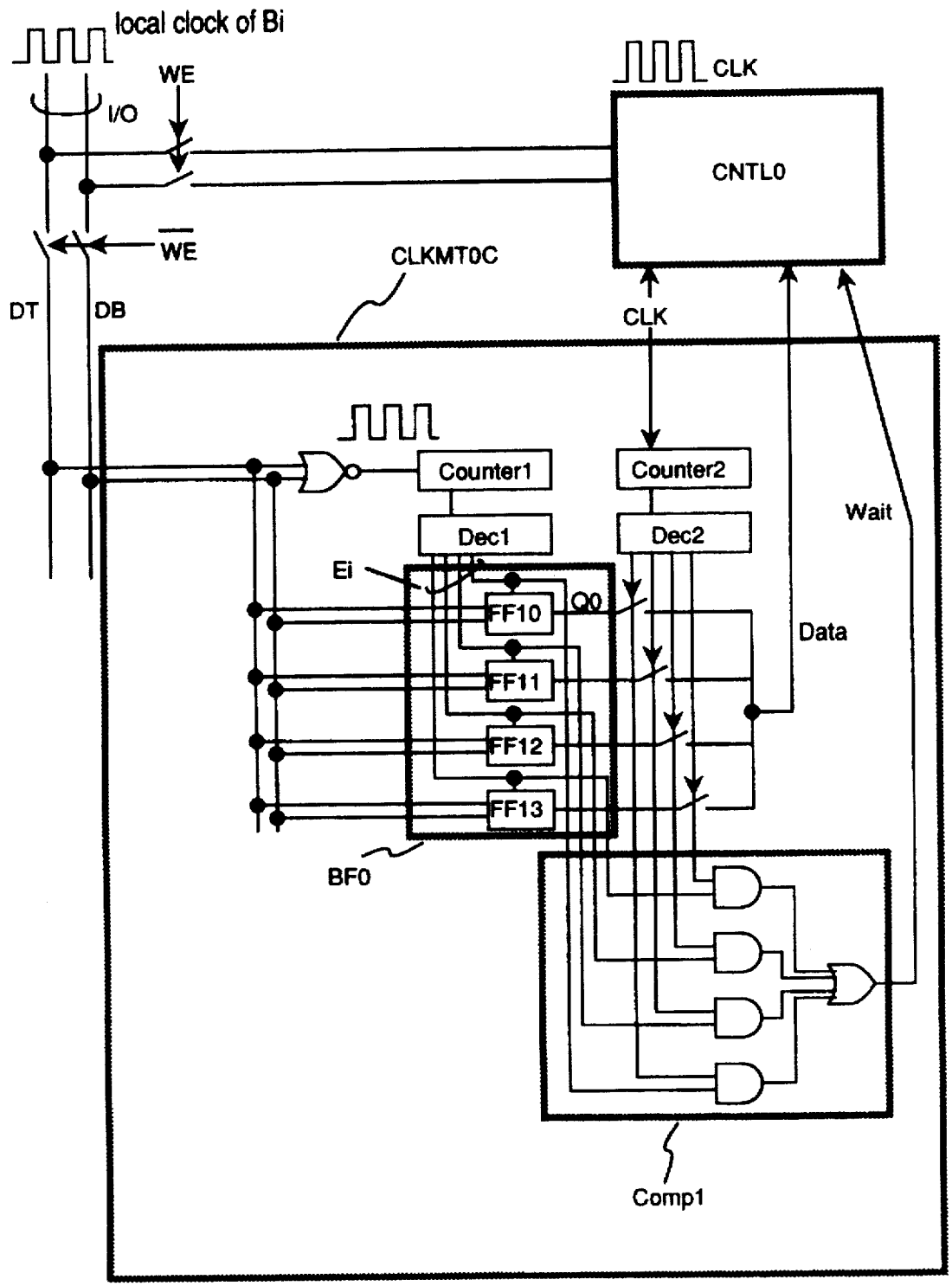
FIG. 12 is a block diagram of another example of a specified circuit structure of the synchronous data-transfer circuitry CLKMT0 of the memory system of FIG. 1 when the clock of an external device has a higher rate than an internal clock of the memory array block.

Referring to FIG. 12, a further embodiment of the synchronous data-transfer circuitry CLKMT0 as a component of the memory system of FIG. 1 will be described next. In FIG. 12, CLKMT0C denotes synchronous data-transfer circuitry representing a specified structure of the circuit block CLKMT0 of FIG. 1. The synchronous data-transfer circuitry CLKMT0C is a preferred circuit which performs data communication synchronously between the memory array block Bi and the control circuit CNTL0 when the clock signal CLK of the external device or control circuit operates at a clock cycle shorter than the local clock cycle of the memory array block Bi in the memory system of FIG. 1.

The synchronous data-transfer circuitry CLKMT0C is different from CLKMT0A of FIG. 4 in that the former includes a logic circuit Comp1 composed of a plurality of AND gates and a single OR gate which delivers a pause signal Wait to the control circuit CNTL0. When a decoder Dec2 is going to designate the data output in a flip-flop FF1i of the buffer BF0 in a state in which a decoder Dec1 designates the data input from the memory array block Bi to the flip-flop FF1i, the logic circuit Comp1 delivers a pause signal Wait to control circuit CNTL0. The pause signal Wait temporarily stops reception of data by control circuit CNTL0. As just described, provision of the function of generating a pause signal for the control circuit CNTL0 ensures normal data transfer without intermission even when the cycle of the clock signal CLK of the control circuit is shorter than the internal clock cycle of the memory array block Bi.

The combination of the circuits Comp0 and HOLD0 of FIG. 11 which generate a buffer-availability indicating signal BFST and the circuit Comp1 of FIG. 12 which generates a pause signal, provides a memory system which normally performs data transfer from the memory array block Bi to the control circuit CNTL0 whether or not the cycle of the clock signal CLK is shorter than the local clock cycle of the array block Bi.

Alternatively, even when no function of generating a pause signal for the control circuit CNTL0 is provided in the synchronous data-transfer circuitry, normal data transfer from the memory array block Bi to the control circuit CNTL0 is performed by delaying the start of transfer of a series of data, delivered from the memory array block B1, from the buffer BF0 to the control circuit CNTL0. This is achieved by starting data-transfer from the buffer BF0 to the control circuit CNTL0 when the buffer BF0 is substantially full. In this case, since the cycle of the clock signal CLK from the control circuit is shorter than the local clock cycle of the memory array block Bi (that is, the data-input rate of the buffer BF0 is smaller than the data-output rate of the buffer BF0), the data stored in the buffer BF0 gradually decreases. In this case, the buffer BF0 is required not to be empty before the data-output ends. The timing of the start of data transfer from the buffer BF0 to the control circuit CMTL0 is determined in dependence on the number BL of required data in serial address. As the BL increases, the timing of the start of the data transfer is delayed. By this method, data-transfer from the memory array block Bi to the control circuit CNTL0 is successfully performed without intermission even when the cycle of the clock signal CLK from the control circuit is shorter than the local clock cycle of the memory array block Bi.

By combining this method with the method described with reference to the embodiment 1, a system is provided where data-transfer is successfully performed from the memory array block Bi to the control circuit CNTL0 even when the cycle of the clock signal CLK is shorter than the local clock cycle of the memory array block Bi or vice versa.

According to the present embodiment, advantageously, a memory system is provided where charging/discharging of the clock signal lines throughout the whole system is not required and the semiconductor chip consumes a low current. In addition, noise due to the clock signal lines throughout the whole system being charged/discharged at high speed is prevented. Since uneven clock delays between the memory array blocks Bi are not required to be considered in design, design is facilitated, advantageously. When this embodiment is applied as a memory system to an electronic device which includes a CPU and a plurality of memory chips, system design has a margin, advantageously. For example, in the present embodiment, the memory array block Bi is not required to operate at the frequency of the clock signal CLK of the control circuit, unlike the conventional structure. Thus, the use of an inexpensive relatively low-speed memory chip as the memory array block Bi and a high-speed CPU as the control circuit CNTL0 provides an inexpensive memory system which operates at high speed as a whole.

<Embodiment 7>

Figure 15:
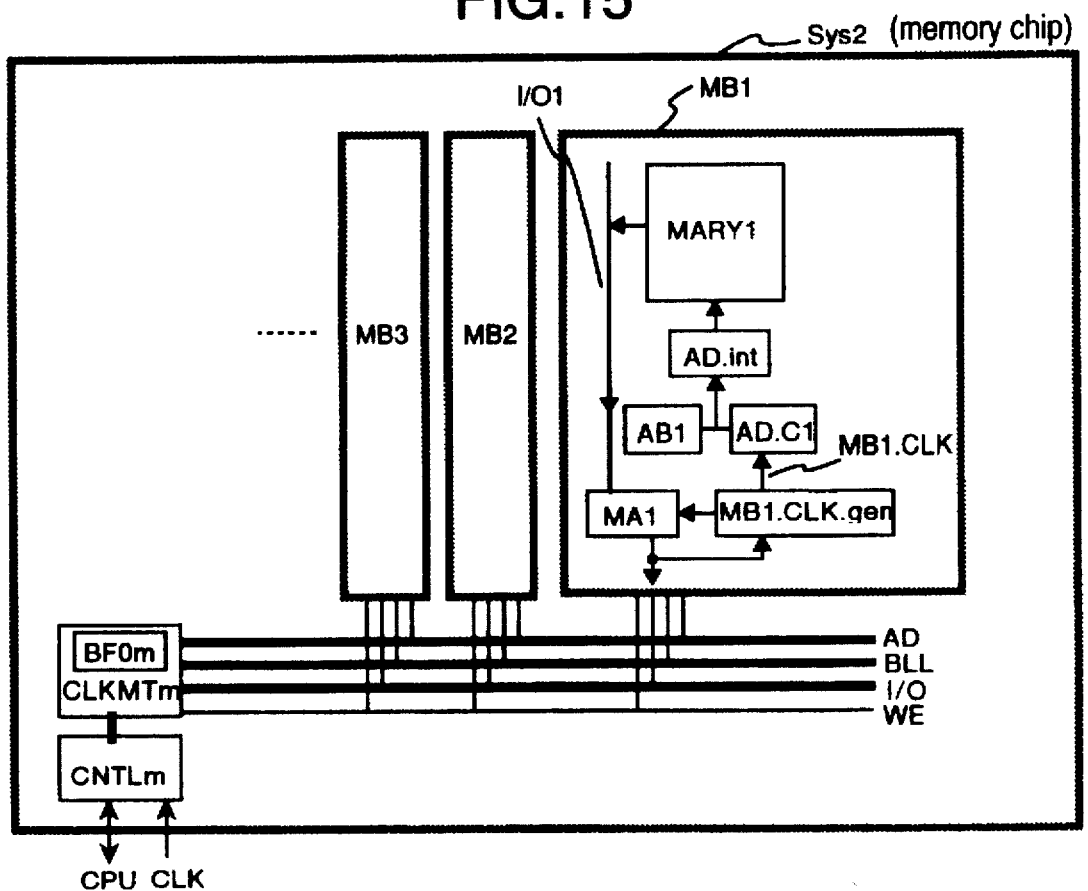
FIG. 15 is a block diagram indicative of an essential portion of a further embodiment of the memory system according to the present invention applied to a semiconductor memory chip.

FIG. 15 is a block diagram indicative of an essential portion of a further embodiment of the memory system. The present embodiment is a memory chip, the address bus of which is used for delivering information on a block select signal, in addition to an initial address. In this embodiment of the memory chip, no signal line such as the block select signal $\overline{BS}$ used in the embodiments of FIGS. 1 and 8 is thus shown.

In FIG. 15, Sys2 denotes a memory chip, which includes at least a plurality of memory array blocks MBi (i=1, 2, . . . ); synchronous data-transfer circuitry CLKMTm which includes a buffer BF0m which adjusts the timing of outputting a series of data coming from a memory array block MBi through a complementary data-line pair I/O so as to be synchronous with a clock signal CLK of a CPU; and a control circuit CNTLm which is an input/output interface to/from the CPU.

Each memory array block MBi includes at least a memory array MARYi, an initial address buffer ABi, an address counter AD.Ci, an internal address buffer AD.int, a main amplifier MAi, an internal complementary data-line pair I/Oi and a local clock generator MBi.CLK.gen. In addition, the synchronous data-transfer circuitry CLKMTm is connected by an address bus AD, a signal line BLL which transfers the number BL of required data in serial address or burst length, a complementary data-line pair I/O and a write enable signal WE line to the respective memory array blocks MBi. The control circuit CNTLm operates in response to an external clock signal CLK from the CPU.

The memory chip Sys2 of this embodiment operates as follows. When the control circuit CNTLm receives from the CPU information on a data readout request, an initial address "a" and the number BL of required data in serial address, memory array block select information is delivered through the address bus AD to the memory array block. Assume that, for example, a memory array block MB1 is selected by the block select information. At this time, since the write enable signal WE delivered from the control circuit CNTLm is low in level, the memory array block MB1 recognizes that data transfer is performed from the memory array block MB1 to the control circuit CNTLm.

The initial value of the address counter AD.C1 of the memory array block MBi is 0. When the initial address "a" is delivered through the address bus AD and the number BL of required data in serial address is delivered through the signal line BLL to the memory array block MB1, the initial address "a" is stored in the initial address buffer AB1. The internal address AD.int of the memory array block MB1 is set at "a" on the basis of the initial value of 0 of the address counter AD.C1 and the initial address "a" stored in the initial address buffer AB1. As a result, the data at the address "a" is processed internally by the memory array MARY1 and the processed data is then delivered through the internal complementary data line pair I/01 and main amplifier M1 to the complementary data-line pair I/O. Simultaneously, the output of the main amplifier MA1 is detected by the internal clock generator MB1.CNK.gen to thereby generate a clock signal MB1.CLK indicative of the termination of one data output. By this clock signal MB1.CLK, address counter AD.C1 is caused to count up. In response to this operation, the internal address AD.int changes from a to a+1. Thus, data at the address a+1 is processed internally by the memory array MARY1 and the processed data is then delivered through the internal complementary data-line pair I/O1 to the main amplifier MA1 and hence to the complementary data-line pair I/O, and the termination of the data output is detected by the internal clock generator MB1.CLK.gen again. Thereafter, similarly, data transfer is iterated until the designated number of data in serial address is obtained. That is, by the output from the main amplifier MA1 of the memory array block MB1, a local clock signal MB1.CLK is generated self-synchronously and hence data is output to the complementary data-line pair I/O one after another. When a carry signal of the address counter AD.C1, which bit count corresponds to the designated number BL of data in serial address, changes from low to high in level, transfer of the series of data is terminated and the address counter AD.C1 is reset at 0. The synchronous data-transfer circuitry CLK-MTm temporarily fetches data coming through the complementary data-line pair I/O in the buffer BF0m thereof for time-adjusting purposes and outputs the data at the cycle of the clock signal CLK of the CPU. The temporary storage of the buffer BF0m in this case is similar to that of the buffer BF0 described in the embodiment of FIG. 1.

Data writing from the CPU to the memory chip Sys2 is performed as follows: Assume that, for example, the memory array block MB1 has been selected in a manner similar to that used in the reading operation mentioned above. The memory array block MB1 recognizes that data transfer should be performed from the control circuit CNTLm to the memory array block since the write enable signal WE from the control circuit CNTLm is high in voltage level. The subsequent writing operation is performed in a manner similar to that mentioned with reference to the embodiment 3 of FIG. 7. In this case, changes in the voltage levels on the complementary data-line pair I/O due to the data transfer are detected to thereby generate a pulse, and the address counter AD.C1 is caused to count up for self-synchronization of the memory array block. After finishing the writing of the serial data, the address counter AD.C1 is reset at 0 to terminate the series of operations, which is similar to the manner performed when the data is read out, as mentioned above.

In the above operation, since the memory array block MB1 performs read/write operations for serial data in a self-synchronous manner when the count of the address counter AD1 is other than 0, the memory array block MB1 may be disconnected from the address bus AD, which allows the control circuit CNTLm to prepare signals for the next operation on the address bus AD, to thereby avoid signal delays and hence achieve a high-speed operation.

Alternatively, an arrangement may be used in which the number BL of required data in serial address is transferred through the address bus AD as in the embodiments described previously, without providing a signal line BLL for the BL separately. In that case, since the BL cannot be transferred in parallel, the system operation is delayed accordingly.

Figure 16:
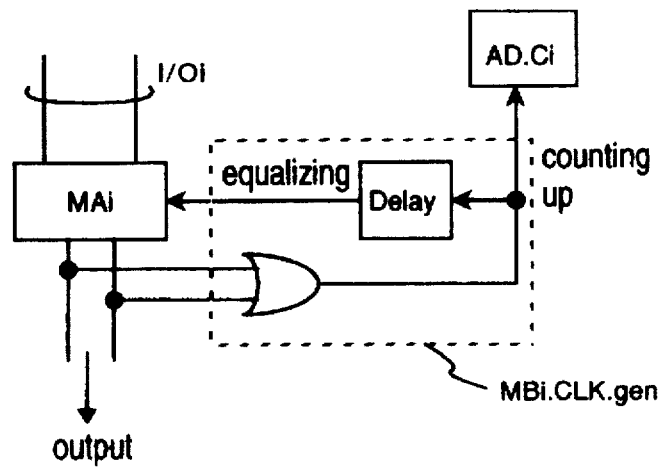
FIG. 16 is a block diagram indicative of one example of an internal clock generator of the memory system of FIG. 15.

FIG. 16 is a block diagram indicative of one example of a specified circuit structure of the local clock generator MBi.CLK.gen of FIG. 15. In this case, the local clock generator MBi.CLK.gen is composed of an OR gate which receives complementary outputs from the main amplifier MAi and provides its output for an address counter AD.Ci, and a delay unit "Delay" which provides the OR gate output as an equalize signal for the main amplifier MAi.

The operation of the local clock generator MBi.CLK.gen will be described next. When one of the serial data on a first address "a" is output to the internal complementary-line pair I/Oi of the memory array block MBi and thence through the main amplifier MAi to the complementary data-line pair I/O, the output of the OR gate which receives the complementary outputs from the main amplifier MAi becomes high in voltage level to thereby cause the address counter AD.Ci to count up. That is, after the termination of one data output is detected, the address is changed and output of the next data starts. After the output of the OR gate is delayed by a given time by the delay circuit Delay, it is then delivered to the main amplifier MAi to thereby equalize same and put same in a standby state again. Thus, the main amplifier MAi waits for the next data output. By repetition of these operations, a series of data is output.

According to the present embodiment of FIGS. 15 and 16, the address counter AD.Ci and the local clock generator MBi.CLK.gen are provided for each memory array block MBi for self-synchronization. Thus, the signal line of the address bus AD is only required to be charged/discharged when the initial address of the consecutive data is transferred, whereas in the conventional memory system the signal line of the address bus AD extending from the input control unit to the memory array block is required to be charged/discharged each time address data is transferred. Thus, in this embodiment, the current consumption and noise are reduced and the processing operation is performed at an increased speed, advantageously. Advantages similar to those (1)–(5) described with reference to FIG. 2 are obtained.

<Embodiment 8>

Figure 17:
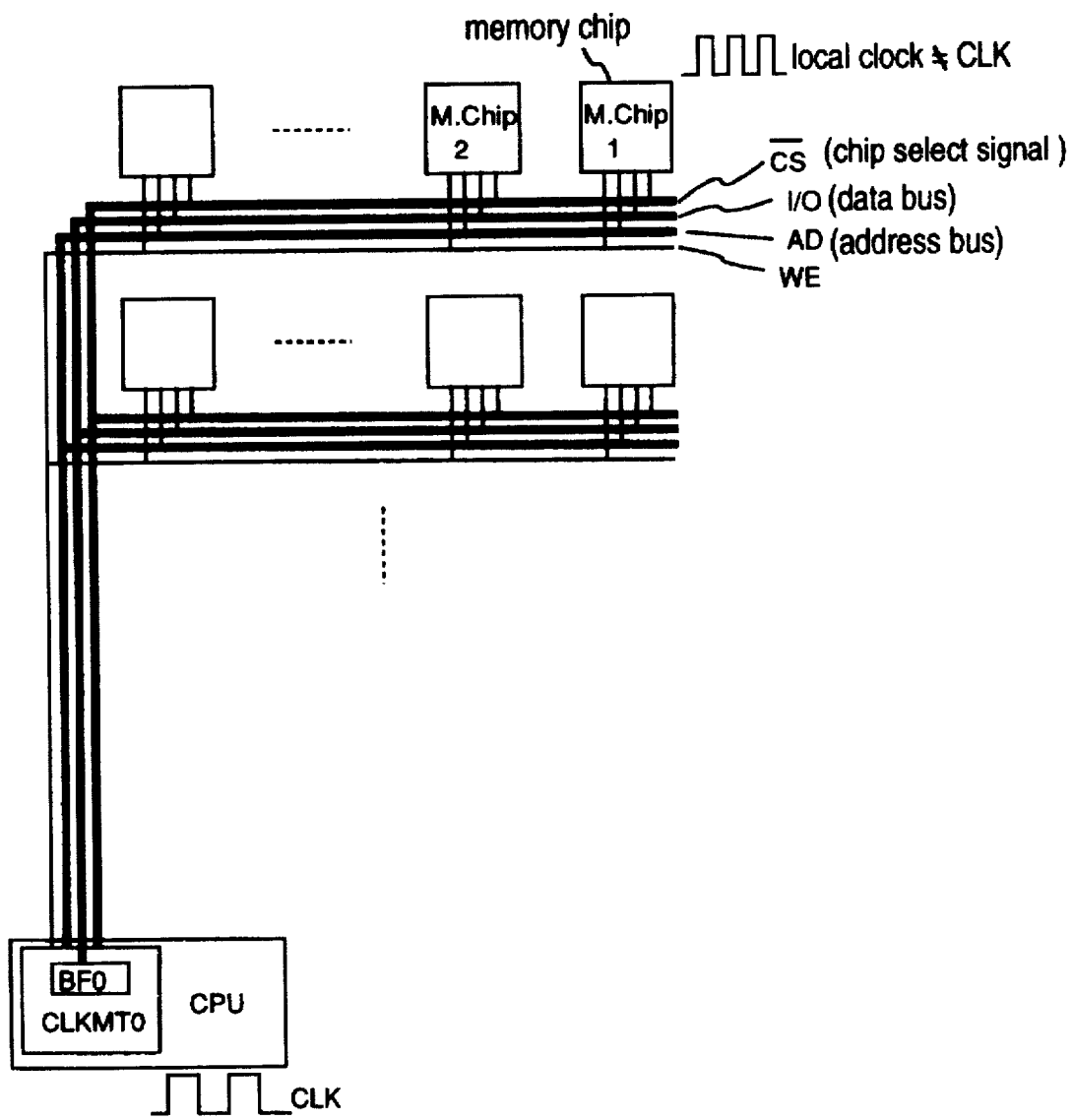
FIG. 17 is a block diagram indicative of an essential portion of a still further embodiment of the memory system according to the present invention applied to an electronic device composed of a CPU and a plurality of memory chips.

FIG. 17 is a block diagram indicative of an essential portion of a still further embodiment of the memory system, which includes a CPU and a plurality of memory chips. The CPU corresponds to the control circuit CNTL0 of the embodiment of FIGS. 1 and 8, and the memory chips M.Chip i (i=1, 2, ...) correspond to the memory array block Bi. Synchronous data-transfer circuitry CLKMT0 which includes a buffer BF0 is provided in or close to the CPU. The synchronous data-transfer circuitry CLKMT0 of the CPU is connected by signal lines for a chip select signal $\overline{CS}$, a complementary data-line pair I/O, an address bus AD and a write enable signal WE to the respective memory chips M.Chip 1, M.Chip 2, ... Each of the memory chips M.Chip 1, M.Chip 2, ... operates at its own local clock cycle different from the clock signal CLK of the CPU. By the methods described with reference to FIGS. 1–12, data transfer between the CPU and the respective memory chips M.Chip 1, M.Chip 2, ... is performed consistently and cooperatively. The chip select signal $\overline{CS}$ corresponds to the block select signal $\overline{BS}$ used in the embodiment of FIGS. 1 and 8.

The present embodiment does not require charging/discharging of the clock signal lines 10 provided throughout the whole memory system as does the conventional memory system of FIG. 18. Thus, a memory system is provided which consumes a low current and generates low noise. A high-speed memory system is provided for the same reason as is described with reference to FIGS. 13 and 14.

While the preferred embodiments of the present invention have been described above, the present invention is not limited to those embodiments. Many changes and modifications of the present invention are possible without departing from the spirit and scope of the present invention.

As will be clear from the above embodiments, according to the present invention, in a memory system which includes at least a plurality of memory blocks and a common control circuit which controls the respective memory blocks, synchronous data-transfer circuitry is provided, including a buffer having a plurality of registers in order to modulate the transfer rate of serially incoming data. The buffer of the synchronous data-transfer circuitry is connected by a complementary data-line pair I/O to the memory blocks, while the control circuit controls the cycle of the output from the synchronous data-transfer circuitry. Thus, the memory system is operated synchronously with a clock of an external device without distribution of clock signal lines extending from the common control circuit to the respective memory blocks. Further, even when the memory system increases in size, the processing rate is not deteriorated by possible delays of clocks in the memory system, and data transfer is performed in a synchronous manner.

In addition, the present invention provides the following advantages: each memory block may use a self-synchronous pipeline system which detects the termination of one data processing operation and starts the next data processing operation. As a result, the marginal design of the clock length, which should always be longer than the processing times in any stages in the conventional system operating synchronously with an external clock, has nothing to do with the present self-synchronous system. Therefore, a high-speed memory system is provided. In addition, the time taken for the first one of consecutive data to be obtained is reduced.

Since no charging/discharging of the clock lines throughout the whole memory system is required, the current consumption in the memory system is reduced. Also, noise which would be generated due to charging/discharging of the clock lines distributed throughout the whole memory system is eliminated to thereby provide a high-reliability memory system.

In addition, in the design of the memory system, there is no need for consideration of possible clock signal delays between the respective memory blocks and the control circuit, and design is concluded within the respective memory blocks, so that design of the memory system is facilitated.

The above advantages of the present invention are provided whether the memory system is made of a semiconductor memory chip which includes a plurality of memory array blocks or the memory system is made of an electronic device which includes a CPU and a plurality of memory chips.

In a semiconductor memory chip which includes a plurality of memory array blocks, an address counter is provided for each block, so that the address bus signal line is required to be charged/discharged only when the initial address of the consecutive data is transferred, thereby reducing current consumption and noise. Hence, the memory system achieves high-speed processing operations.

What is claimed is:

1. A memory system comprising:

a plurality of memory blocks;

a synchronous data-transfer circuit for converting serially incoming data having a cycle of a first clock to data having a cycle of a second clock, and serially outputting said data having the cycle of the second clock; and a data bus coupled between an input of said synchronous data-transfer circuit and said plurality of memory blocks;

wherein read data from one of said plurality of memory blocks is serially supplied to the input of said synchronous data-transfer circuit via said data bus at the cycle of the first clock;

wherein the read data are serially outputted from said synchronous data-transfer circuit at the cycle of the second clock, and wherein the first clock is a synchronous to the second clock.

2. A memory system comprising:

a plurality of memory blocks;

a common control circuit for controlling each of said plurality of memory blocks;

a complementary data bus coupled between said common control circuit and said plurality of memory blocks; and a data input terminal coupled to said common control circuit;

wherein said common control circuit converts a serial data supplied from said data input terminal to a pair of complementary serial data using a second clock, and supplies the pair of complementary serial data to said complementary data bus; and wherein one of said plurality of memory blocks to which the pair of complementary serial data is transferred extracts an internal clock from the pair of complementary serial data in order to change a write address therein.

3. A memory system according to claim 2, further comprising:

a synchronous data-transfer circuit for converting serially incoming data having a cycle of a first clock to data having a cycle of the second clock and serially outputting said data having the cycle of the second clock;

wherein an input of said synchronous data-transfer circuit is coupled to said complementary data bus when read data is serially supplied from one of said plurality of memory blocks at the cycle of the first clock.

4. A memory system according to claim 3, wherein said synchronous data-transfer circuit comprises a buffer including a plurality of registers, first switch for cyclically connecting respective inputs of the registers one at a time to the complementary data bus in response to a change in a pair of voltage levels of the complementary data bus from the same value to different ones or vice versa; and second switches for cyclically connecting respective outputs of the registers one at a time to a data output terminal in response to the second clock.

5. A memory system according to claim 1, wherein each of said plurality of memory blocks comprises an address buffer and an address counter.

6. A memory system according to claim 5, further comprising:

a common control circuit for controlling each of said plurality of memory blocks, wherein each of said plurality of memory blocks comprises output means for outputting, in accordance with an initial address and a number of requested data delivered from said common control circuit, a series of data serially to the data bus at the cycle of the first clock without control by said common control circuit; and wherein the maximum number of requested data in serial address delivered from said common control circuit is equal to the number of registers of a buffer of the synchronous data-transfer circuit.

7. A memory system according to claim 5, wherein said synchronous data-transfer circuit comprises a buffer-availability indicating signal generator for monitoring the number of unoutput data which has already been transferred from said one of said plurality of memory blocks to said synchronous data-transfer circuit, but has not yet been outputted from said synchronous data-transfer circuit when said one of said plurality of memory blocks outputs data, and for delivering to said one of said plurality of memory blocks a pause signal for temporarily stopping the operation of said one of said plurality of memory blocks when the number of said unoutput data has exceeded a predetermined number.

8. A memory system according to claim 7, wherein said buffer-availability indicating signal generator sends to said one of said plurality of memory blocks a signal which restarts said one of said plurality of memory blocks when the number of said unoutput data has been reduced to a predetermined number after the operation of said one of said plurality of memory blocks is temporarily stopped by the pause signal.

9. A memory system according to claim 5, further comprising:

a common control circuit for controlling each of said plurality of memory blocks;

wherein said synchronous data-transfer circuit comprises a data monitor for monitoring the number of unoutput data which has already been transferred from said one of said plurality of memory blocks to said sychronous data-transfer circuit, but has not yet been outputted from said sychronous data-transfer circuit, and for sending to the common control circuit a signal for instructing the common control circuit to temporarily stop the outputting of the data from said synchronous data-transfer circuit when the number of said unoutput data has decreased to a predetermined number.

10. A memory system according to claim 1, wherein each of said plurality of memory blocks is one of a plurality of memory array blocks formed on a memory chip; and wherein said sychronous data-transfer circuit is formed on said memory chip.

11. A memory system according to claim 10, wherein each of said plurality of memory array blocks comprises a clock generator for generating the first clock.

12. A memory system according to claim 1, wherein said synchronous data-transfer circuit is a part of a central processing unit formed on a chip, and wherein each of said plurality of memory blocks is a memory chip.

13. A memory system according to claim 1, wherein said data bus is a complementary data bus, and wherein said synchronous data-transfer circuit comprises a buffer including a plurality of registers, first switches for cyclically connecting respective inputs of the registers one at a time to the complementary data bus in response to a change in the paired voltage levels of the complementary data bus from the same value to different ones or vice versa, and second switches for cyclically connecting respective outputs of the registers one at a time to a data output terminal in response to the second clock.

14. A memory system according to claim 2, wherein each of said plurality of memory blocks comprises an address buffer and an address counter.

15. A memory system according to claim 2, wherein each of said plurality of memory blocks is one of a plurality of memory array blocks formed on a memory chip; and wherein said common control circuit is formed on said memory chip.

16. A memory system according to claim 2, wherein said common control circuit and said synchronous data-transfer circuit are a part of a central processing unit formed on a chip, and wherein each of said plurality of memory blocks is a memory chip.

17. A memory system according to claim 5, further comprising:

a common control circuit for controlling each of said plurality of memory blocks;

an address line coupled between said common control circuit and said plurality of memory blocks; and a switch coupled between said address line and one of said plurality of memory blocks;

wherein said switch is turned off when the address counter of the one of said plurality of memory blocks is not in a reset state.

18. A memory system according to claim 14, further comprising:

an address line coupled to said common control circuit and said plurality of memory blocks; and a switch coupled between said address line and one of said plurality of memory blocks;

wherein said switch is turned off when the address counter of said one of said plurality of memory blocks is not in a rest state.

19. A memory system according to claim 5, further comprising:

a common control circuit for controlling each of said plurality of memory blocks;

wherein each of said plurality of memory blocks comprises output means for outputting, in accordance with an initial address and a number of requested data delivered from said common control circuit, a series of data serially to the data bus at the cycle of the first clock.

20. A memory system according to claim 1, wherein the cycle of the first clock is different from the cycle of the second clock.

21. A memory system comprising:

a plurality of memory blocks;

a data bus coupled to said plurality of memory blocks; and a synchronous data-transfer circuit having an input node coupled to said data bus and a output node;

wherein read data from one of said plurality of memory blocks is serially supplied to the input node of said synchronous data-transfer circuit via said data bus;

wherein said synchronous data-transfer circuit converts the read data having a timing of a first clock to data having a timing of a second clock, and outputs the data having the timing of the second clock serially; and wherein said synchronous data-transfer circuit extracts the first clock from the read data in order to convert the read data.

22. A memory system according to claim 21, wherein said data bus is a complementary data bus for transferring a pair of complementary data; and wherein said synchronous data-transfer circuit comprises a buffer including a plurality of registers, first switches for cyclically connecting respective inputs of the registers one at a time to the complementary data bus in response to a change in the paired voltage levels of the complementary data bus from the same value to different ones or vice versa, and second switches for cyclically connecting respective outputs of the registers one at a time to a data output terminal in response to the second clock.

23. A memory system according to claim 22, wherein each of said plurality of memory blocks comprises a clock generator for generating the first clock.

24. A memory system according to claim 21, wherein each of said plurality of memory blocks comprises a clock generator for generating the first clock.

25. A memory system according to claim 23, wherein each of said plurality of memory blocks comprises an address buffer and an address counter.

26. A memory system according to claim 21, wherein each of said plurality of memory blocks is one of a plurality of memory array blocks formed on a memory chip, and wherein said synchronous data-transfer circuit is formed on said memory chip.

27. A memory system according to claim 21, wherein said synchronous data-transfer circuit is a part of a central processing unit formed on a chip; and wherein each of said plurality of memory blocks is a memory chip.

* * * * *